US007442961B2

(12) United States Patent
Sagawa et al.

(10) Patent No.: US 7,442,961 B2
(45) Date of Patent: Oct. 28, 2008

(54) IMAGE DISPLAY DEVICE

(75) Inventors: Masakazu Sagawa, Inagi (JP); Toshiaki Kusunoki, Tokorozawa (JP); Kazutaka Tsuji, Hachioji (JP); Mutsumi Suzuki, Kodaira (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 205 days.

(21) Appl. No.: 11/326,519

(22) Filed: Jan. 6, 2006

(65) Prior Publication Data

US 2006/0202207 A1 Sep. 14, 2006

(30) Foreign Application Priority Data

Mar. 11, 2005 (JP) ............................ 2005-069876

(51) Int. Cl.
*H01L 29/04* (2006.01)
*H01L 27/14* (2006.01)

(52) U.S. Cl. ............................ 257/72; 257/10; 257/59; 257/750

(58) Field of Classification Search .................. 257/72, 257/10, 59, 750
See application file for complete search history.

(56) References Cited

U.S. PATENT DOCUMENTS

| | | | | |
|---|---|---|---|---|
| 5,548,181 | A * | 8/1996 | Jones | 313/309 |
| 2003/0057825 | A1 * | 3/2003 | Kusunoki et al. | 313/495 |
| 2004/0017160 | A1 * | 1/2004 | Sagawa et al. | 315/169.1 |

FOREIGN PATENT DOCUMENTS

| | | |
|---|---|---|
| JP | 07-065710 | 3/1995 |
| JP | 10-153979 | 6/1998 |
| JP | 2002-367503 | 12/2002 |
| JP | 2004-071316 | 3/2004 |
| JP | 2004-234860 | 8/2004 |
| JP | 2004-363075 | 12/2004 |

OTHER PUBLICATIONS

U.S. Appl. No. 11/237,785, filed Sep. 29, 2005, T. Kusunoki.
J. Vac. Sci. Technol.; B11 (2), pp. 429-432 (1993).
Jpn. J. Appl. Phys.; vol. 36, p. 939.
Jpn. J. Appl. Phys.; vol. 63, No. 6, p. 592.
Jpn. J. Appl. Phys.; vol. 66, No. 5, p. 437.

* cited by examiner

*Primary Examiner*—Wai-Sing Louie
*Assistant Examiner*—Marc Armand
(74) *Attorney, Agent, or Firm*—Antonelli, Terry, Stout & Kraus, LLP.

(57) ABSTRACT

The present invention provides an image display device, by which it is possible to prevent dielectric breakdown between a bottom electrode and a top electrode (top electrode bus line), which make up thin-film type electron sources, and which is free of display defect and has longer service life.

On a cathode substrate 10, a bottom electrode 11, a tunneling insulator 12, and a top electrode 13 are prepared. On a lower layer of the top electrode 13, a top electrode bus line 16 is formed, and the top electrode 13 is reliably connected to the top electrode bus line 16 via a contact electrode 15. A field insulator 12A, a lower layer 14*a* of the interlayer insulator deposited by sputtering and an upper layer 14*b* of the interlayer insulator are laminated between the top electrode 13 and the contact electrode and the bottom electrode 11, and the bottom electrode 11 is insulated from the top electrode 13 (top electrode bus line 16).

16 Claims, 37 Drawing Sheets

FIG. 2 0 (a)
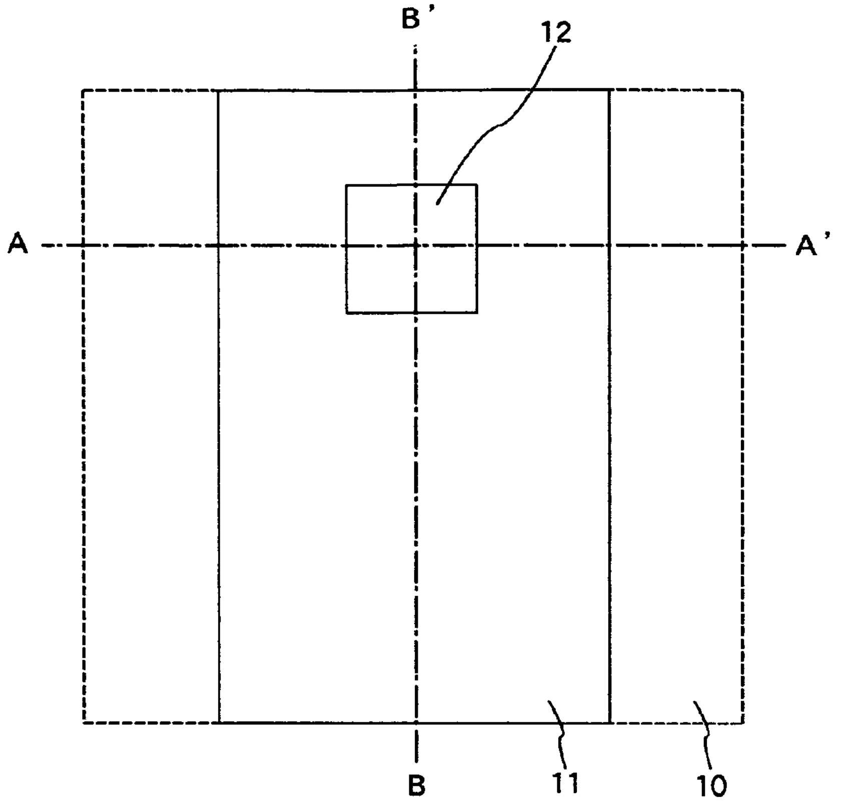
FIG. 2 0 (b)
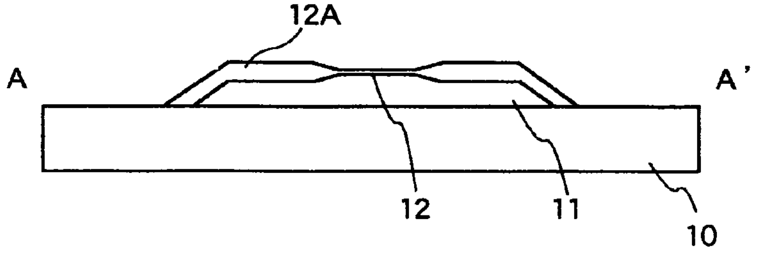
FIG. 2 0 (c)
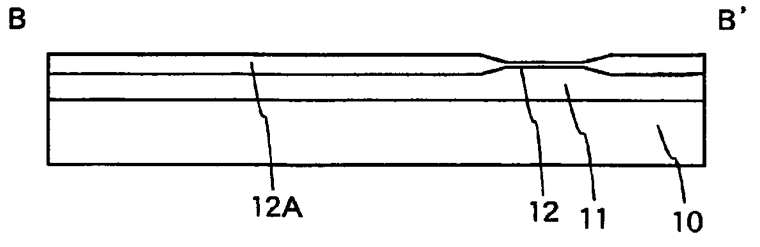

FIG. 2 1 (a)
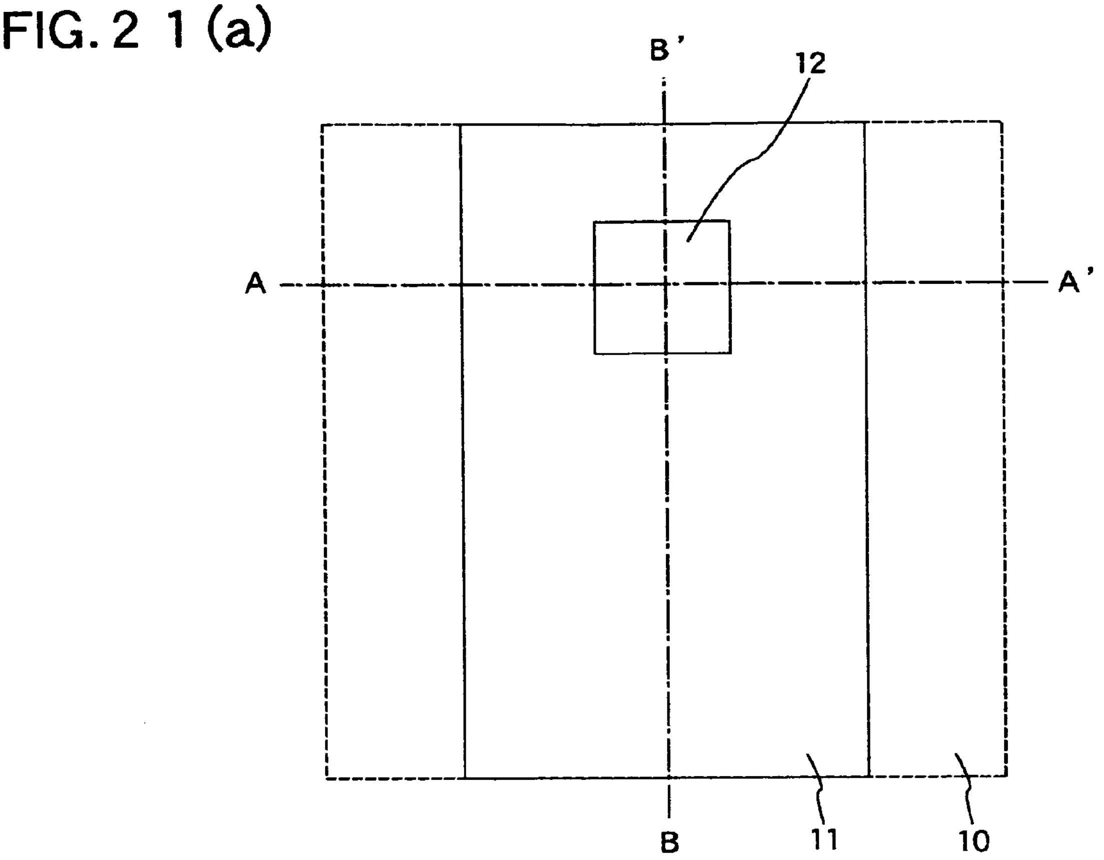
FIG. 2 1 (b)
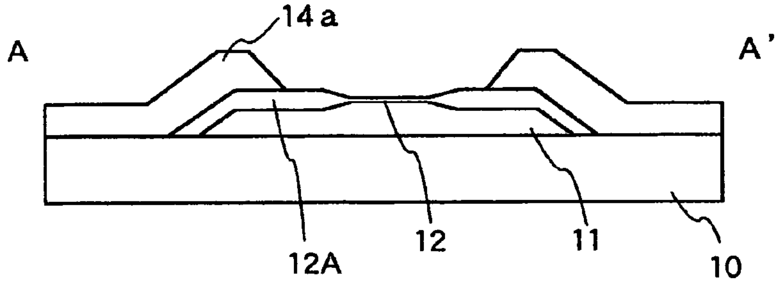
FIG. 2 1 (c)
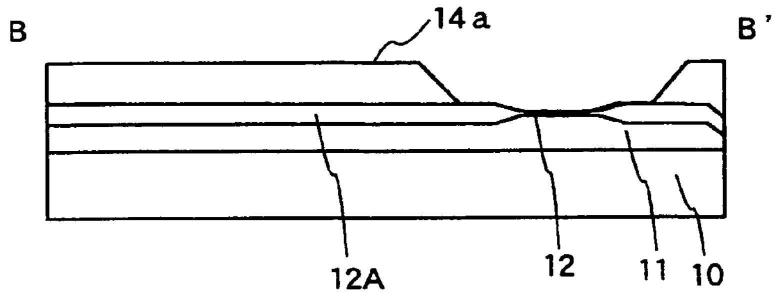

FIG. 2 4 (a)
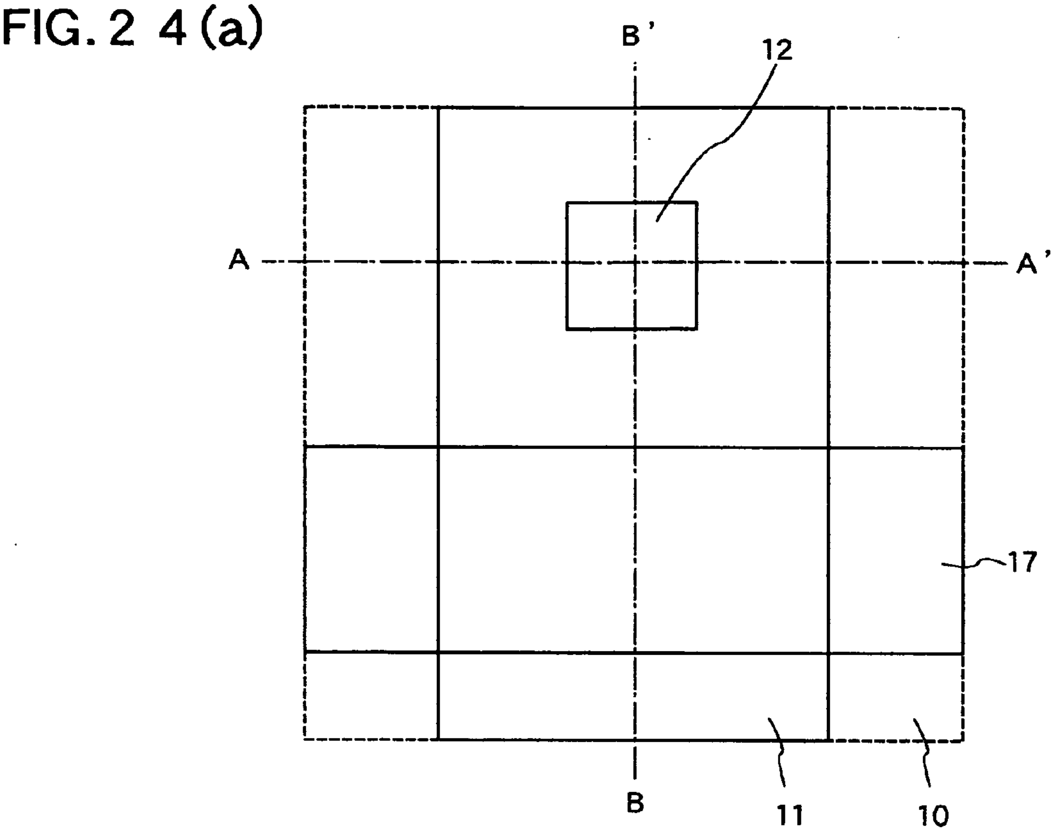
FIG. 2 4 (b)
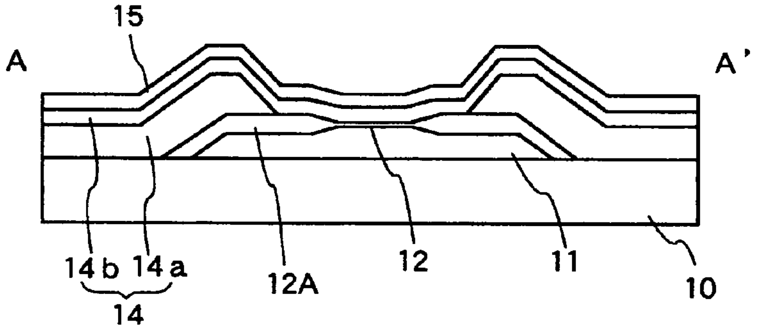
FIG. 2 4 (c)
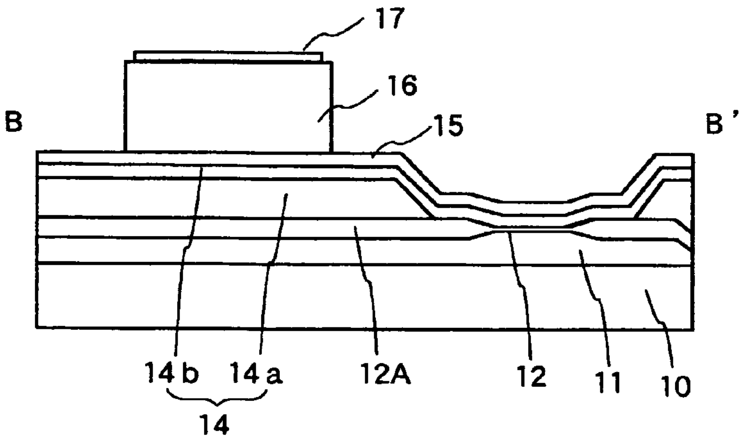

FIG. 2 8 (a)
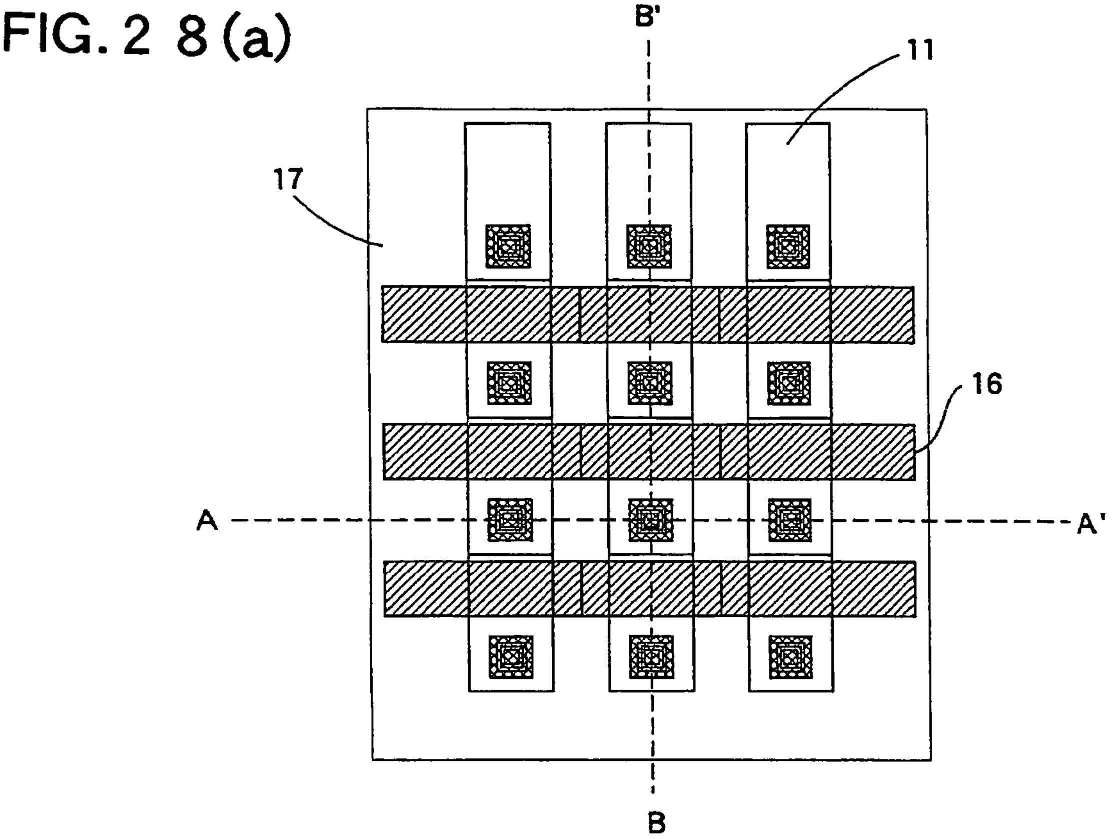
FIG. 2 8 (b)
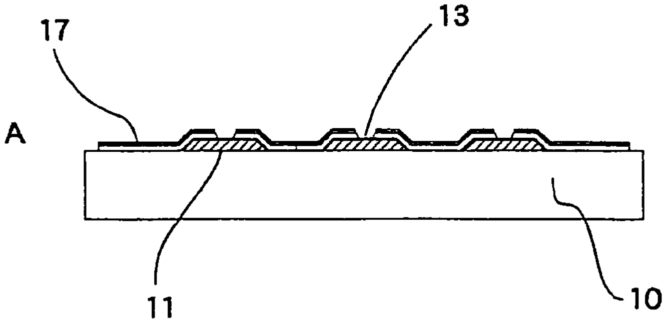
FIG. 2 8 (c)
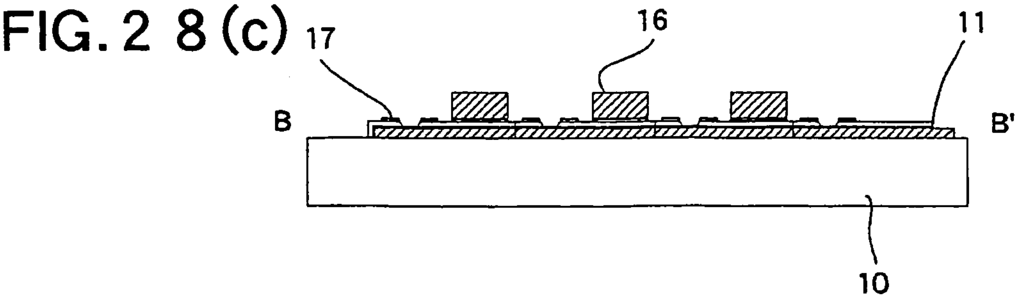

FIG. 3 0 (a)
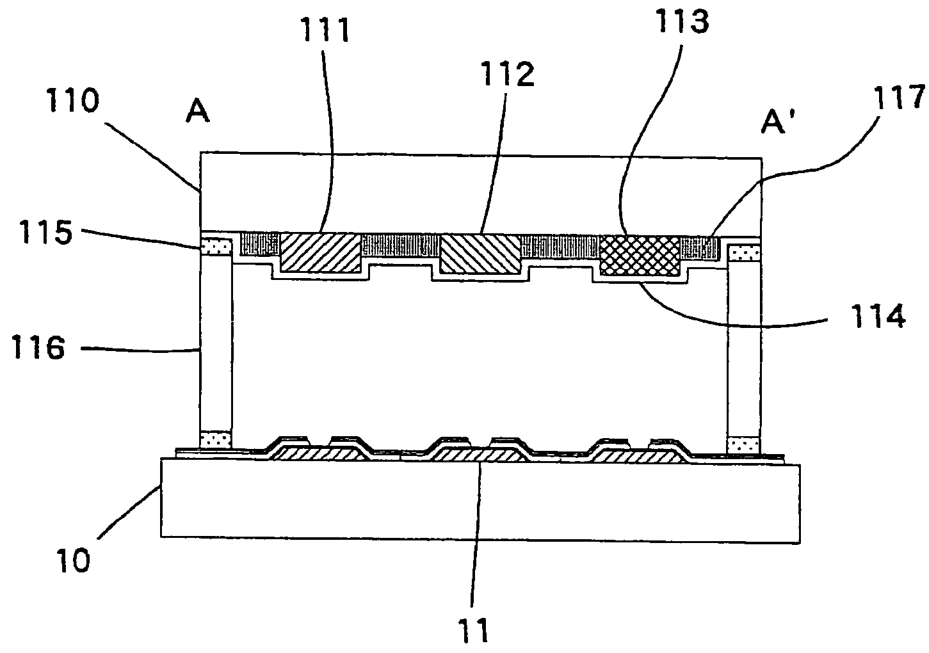
FIG. 3 0 (b)
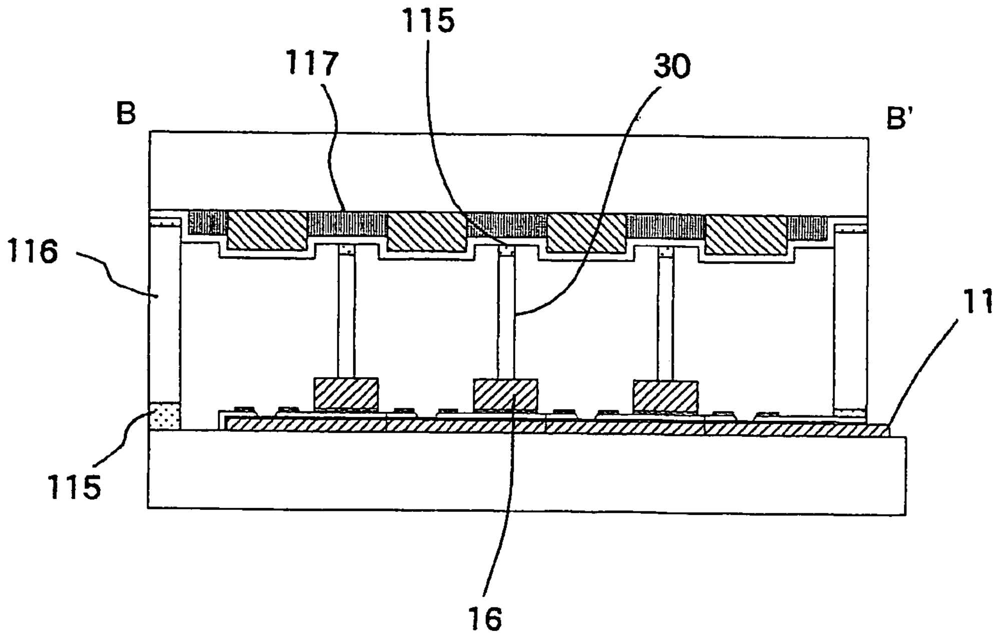

FIG. 34

| | |
|---|---|
| Al | −117MPa |
| Cu | −250MPa |
| Mo | −607MPa |
| Cr | −1910MPa |

IMAGE DISPLAY DEVICE

BACKGROUND OF THE INVENTION

The present invention relates to an image display device and a method for manufacturing the same. In particular, the invention relates to an image display device, also called a flat panel display of emissive type, using thin-film type electron source array.

A type of image display device has been developed, which uses emission type electron sources, also called thin-film type electron sources, in micro-size and of integratable type. The thin-film type electron source is designed in a three-layer thin-film structure comprising a top electrode, an electron accelerator, and a bottom electrode. Voltage is applied between the top electrode and the bottom electrode, and electrons are emitted from the surface of the top electrode into vacuum space. There are different types of devices, which include, for instance: an MIM (metal-insulator-metal) type with a metal layer, an insulator and a metal layer laminated on each other, an MIS (metal-insulator-semiconductor) type with a metal layer, an insulator, and a semiconductor layer laminated on each other, a metal-insulator-semiconductor type, an EL type, a porous silicon type, etc.

The Patented References 1 and 2 describe an MIM type. The Non-Patented Reference 1 describes a metal-insulator-semiconductor type. The Non-Patented Reference 2 describes a metal-insulator-semiconductor-metal type. The Non-Patented Reference 3 describes an EL type, and the Non-Patented Reference 4 discloses a porous silicon type.

FIG. 1 is a cross-sectional view to explain an example of structure of a thin-film type electron source by taking an example of the MIM type. FIG. 2 is a drawing to explain operating principle of the thin-film type electron source. The MIM type thin-film electron source comprises a bottom electrode 11 formed on a substrate 10, a top electrode 13 laminated to intersect the bottom electrode via a tunneling insulator (also called a tunneling insulator) 12, and an interlayer insulator 14. Electric current is supplied to the top electrode 13 via a top electrode bus line 16 and a contact electrode 15.

Now, description will be given on operating principle of the thin-film type electron source shown in FIG. 1 by referring to FIG. 2. In FIG. 2, driving voltage Vd is applied between the top electrode 13 and the bottom electrode 11, and electric field within the tunneling insulator 12, serving as an electron accelerator, is turned to about 1 to 10 MV/cm. Then, electrons near Fermi level in the bottom electrode 11 pass through potential barrier due to tunneling phenomena. Electrons are injected to the tunneling insulator 12 and to a conduction band of the top electrode 13, and the electrons are turned to hot electrons.

These hot electrons are diffused in the tunneling insulator 12 and in the top electrode 13 and lose energy. A part of the hot electrons having energy higher than the work function $\phi$ of the top electrode 13 are emitted into vacuum space 20. In other types of the thin-film electron sources, the principle may be somewhat different but there are common features that hot electrons are emitted via the thin top electrode 13.

The bottom electrode comprising the thin-film type electron sources, the top electrode arranged to intersect the bottom electrode, and a top electrode bus line for supplying electric current to the top electrode are placed in form of a 2-dimensional matrix to make up a thin-film type electron source array. Then, a display signal is applied to the bottom electrode, and a scan signal is applied to the top electrode (top electrode bus line), and electrons from the thin-type electron source on the intersections are directed toward phosphor and are excited. As a result, an image display device is made up. In this case, the top electrode but line is turned to scan line bus line. The thin-film type electron sources are described, for example, in the following references:

[Patented Reference 1] JP-A-7-65710

[Patented Reference 2] JP-A-10-153979

[Non-Patented Reference 1] J. Vac. Sci. Technol.; B11(2), pp. 429-432 (1993).

[Non-Patented Reference 2] Jpn. J. Appl. Phys.; Vol. 36, p. 939.

[Non-Patented Reference 3] Jpn. J. Appl. Phys.; Vol. 63, No. 6, p. 592.

[Non-Patented Reference 4] Jpn. J. Appl. Phys.; Vol. 66, No. 5, p. 437.

As described above, in this type of image display device, a display signal is applied on the bottom electrode, and a scan signal is applied on the top electrode (top electrode bus line), and thin-film type electron sources at intersections are selected. For this reason, insulation between the bottom electrode of the thin-film type electron source array and the top electrode (top electrode bus line) is very important. If insulation between the two electrodes is poor, electric short-circuiting may occur between the bottom electrode and the top electrode or the top electrode bus line, and this may cause defects in the image. In this respect, the tunneling insulator, serving as an electron accelerator, and the interlayer insulator for limiting the electron emission region must be free of defects.

Conventionally, an electrochemical film deposition method called anodic oxidation has been used for forming a tunneling insulator and an interlayer insulator. This film deposition method is extremely superior to the other film deposition method in providing uniform and even film quality and film thickness, and it is suitable for the formation of a display panel, which makes up a large scale (large area) image display device comprising this type of electron source array. However, in the anodic oxidation, there are the problems as described in (1) to (3) below.

(1) When there is a portion where electric current does not flow due to foreign object or the like attached on the surface, poor insulation occurs. (2) In case a display panel with the thin-film type electron source array formed on it is provided, mechanical damage may occur on the interlayer insulator of the thin-film type electron source array because of the atmospheric pressure applied on the cathode substrate via spacers, and dielectric breakdown of time zero is induced. (3) In general, capacitance of the thin-film type electron source is higher than that of a liquid crystal device. This is because specific dielectric constant of alumina, serving as the insulating film, is as high as 10, and also because film thickness is as thin as about 10 nm. For this reason, a driving circuit chip (IC or LSI) having sufficient ability to supply electric current must be used, and this implies that higher circuit cost compared with the liquid crystal device is required.

In the capacitance, the tunneling insulator and the interlayer insulator occupy one half of the capacitance respectively. The tunneling insulator is about 1/10 in film thickness and area compared with the interlayer insulator. On the other hand, dielectric constant is the same for these two (specific dielectric constant: up to 10), and capacitance is almost the same. To decrease the parasitic capacitance, film thickness of the interlayer insulator should be increased, while it is difficult to simply increase the oxidation voltage because of the relation with withstand voltage of the resist mask for local oxidation.

It is an object of the present invention to provide an image display device, which is free of display defects and has long service life, and by which it is possible to prevent dielectric breakdown between the bottom electrode comprising the thin-film type electron sources and the top electrode (top electrode bus line).

The electron sources as described above are arranged in form of matrix in a plurality of columns (e.g. in horizontal direction) and in a plurality of rows (e.g. in vertical direction). A number of phosphor film (phosphors) and anodes to match each of the electron sources are arranged in vacuum space to make up an image display device. When an image is displayed on the image display device with the arrangement as described above, a driving method called "line-sequential driving" is normally adopted. This is a method, by which the displaying for each frame is performed for each scan line (horizontal direction) when 60 still pictures (60 frames) are displayed per second. Therefore, the electron sources to match the number of data lines positioned on the same scan line are all operated at the same time. During operation, electric current flows on the scan line. The value of this electric current is a product of the value of the electric current (consumed by the electron source contained in a sub-pixel (a mono-color pixel to make up one pixel for full color display)) multiplied by the number of all data lines. This scan line current causes voltage drop along the scan line due to wiring resistance, and this hinders uniform operation of the electron source. In particular, when it is wanted to have a large size image display device, the voltage drop caused by the wiring resistance of the scan line is a serious problem.

In the image display device using the thin-film type electron source as the cathode (electron source), the capacity between the scan line and the data line must be reduced for the purpose of reducing power consumption based on the decrease of charge-discharge of the power to the cathode, of decreasing the load of the driving circuit (driver) and of preventing signal delay caused by the decrease of CR time constant. To attain these purposes, the most promising approach is to use a coating type insulating film, which has lower dielectric constant and is easier to have higher film thickness as the interlayer insulator between the scan line and the data line.

However, the coating type insulator is shrunk due to drying and firing after coating, and it is less resistant to tensile stress. In contrast, in the metal wiring formed on the interlayer insulator, a material with relatively higher tensile stress is used. As a result, when a metal wiring having higher tensile stress is deposited on the interlayer insulator, which is formed by the coating type insulating film, cracking may occur, and it is easily peeled off, and this leads to one of the causes for disconnection.

As the material of the wiring, chromium (Cr) or aluminum (Al) is widely used. Chromium is a metal material with very high tensile stress, and when it is deposited on the coating type insulating film, cracking is very likely to develop. Also, the film of the alloy produced from aluminum added with neodymium (Nd) or tantalum (Ta) has relatively low tensile stress immediately after it is deposited as film, while, in the process of sealing and heating of the display substrate, the stress of the alloy film is changed and strong tensile stress develops, and cracking occurs. As a result, the trouble such as disconnection occurs, and this leads to lower reliability. This is not limited to the image display device of matrix type, in which data lines and scan lines are separately formed on the interlayer insulator, but it is the same in other film structures of similar type, which comprise metal thin-film on the coating type insulating film.

It is another object of the present invention to provide an image display device with high reliability and with metal film structure not to cause cracking even when it is deposited on the coating type insulating film.

The image display device according to the present invention is provided with a vacuum panel container, which comprises a cathode substrate where a plurality of thin-film type electron sources are arranged with predetermined spacing, an anode substrate where spot-like or linear phosphor films are arranged to face to each other, a plurality of spacers for supporting said cathode substrate and said anode substrate with predetermined spacing, and a frame glass for maintaining vacuum condition, wherein there are provided a plurality of electric bus lines extending in row direction and in column direction crossing perpendicularly via interlayer insulators, and said cold cathode type electron sources are connected with said electric bus lines in column direction and in row direction at positions corresponding to each of intersection coordinates, and image display is performed by line-sequential driving of the cold cathode type electron sources.

The thin-film type electron sources are provided with a bottom electrode, a top electrode and an electron accelerator interposed between these two. As the interlayer insulator, a thin-film lamination of at least two layers is used, which contains a thin-film insulating material formed by the coating film and having specific dielectric constant of not more than 5 and a thin-film insulating film produced by vacuum film deposition.

Also, in the present invention, in addition to said interlayer insulator of the thin-film lamination with at least two layers, bus lines connected to the top electrode among a plurality of bus lines or the insulating film formed by vacuum deposition among the interlayer insulator are arranged in such manner that at least a part of the pattern end portion of the insulating material suitable for coating film deposition can be covered.

Further, in the present invention, the bottom electrode is made of aluminum or aluminum alloy, and the electron accelerator can be designed as an anodic oxidized film. Also, inorganic or organic polysilazane or a mixture of these two types of polysilazane may be used as the material of the insulation layer formed by coating.

Also, according to the present invention, metal films (such as bus lines on the coating type insulating layer when the coating type insulating film is used as the interlayer insulator) are deposited by using aluminum or copper. Further, on the coating type insulating film, a metal film in contact with the coating type insulating film is made of a high melting point metal such as chromium (Cr), molybdenum (Mo), nickel (Ni), tungsten (W), etc. The metal film is formed in thickness of not more than 10 nm, and a laminated wiring with aluminum or copper deposited on it is used.

More concrete description will be given below on the image display device.

Specifically, the invention provides an image display device, which comprises a cathode substrate and a phosphor substrate, wherein said cathode substrate has thin-film type electron sources arranged in form of matrix, said electron sources are electrically connected with the scan lines and the data lines and emit electrons at each of intersections of a plurality of scan lines and data lines, said phosphor substrate contains phosphor layers with a plurality of colors arranged to match each of said electron sources, there is further provided a coating type insulating film formed by coating method as an interlayer insulator to provide insulation between the scan lines and the data lines, a metal film with internal stress of −200 MPa or lower is used as the scan lines or the data lines formed in contact with the coating type insulating film.

The metal film to prepare the scan lines or the data lines is made of aluminum (pure aluminum) or copper (pure copper)

not containing additional metal, and a high melting point metal with melting point of 1200° C. or more is laminated on the metal film. As the high melting point metal, at least two types selected from chromium, nickel, molybdenum, and tungsten, or alloys of two types of more of these metals are suitable.

Also, in the image display device of the present invention, a high melting point metal film with film thickness of not more than 10 nm is formed on the coating type insulating film as scan lines or data lines to be formed on the coating type insulating layer. A metal film of pure aluminum or pure copper is deposited on it, and a laminated film is prepared by sequentially forming thin films of metal materials with melting point higher than that of pure aluminum or pure copper on it.

As the coating type insulating film, an insulating film prepared by dry process under vacuum condition or an insulating film prepared by wet process in solution or organic or inorganic silicon polymer or polysilazane formed by coating method on the laminated films is used.

According to the present invention, an image display device can be provided, which can prevent initial dielectric breakdown (time zero) and to improve production yield. Dielectric breakdown over time can be prevented and perfect operation and longer service life are assured.

Also, the present invention provides an image display device with high reliability, by which it is possible to prevent cracking and film peeling caused by stress of metal film lines formed on the coating type insulating layer even when the coating type insulating layer is used as the interlayer insulator. Because the coating type insulating layer with high film thickness and low dielectric constant is used as the interlayer insulator, it is possible to achieve lower capacity of bus lines, to decrease power consumption, to reduce driver load, and to prevent signal delay.

BRIEF DESCRIPTION OF THE DRAWINGS

FIG. 20 represents drawings to explain the method for manufacturing the thin-film type electron source in Embodiment 3 of the present invention;

FIG. 21 represents drawings similar to those of FIG. 20 for manufacturing the thin-film electron source in Embodiment 3 of the present invention;

FIG. 24 represents drawings similar to those of FIG. 23 for manufacturing the thin-film electron source in Embodiment 3 of the present invention;

FIG. 28 represents drawings to explain an arrangement of Embodiment 4 of the image display device using MIM type cathode substrate;

FIG. 30 shows cross-sectional views of an image display device with a cathode substrate and an anode substrate affixed together;

FIG. 31 is a connection diagram of the image display device to a driving circuit;

FIG. 32 is a diagram to explain an example of waveforms of the voltage generated in each of the driving circuits;

FIG. 34 is a table to explain intrinsic stress of principal bus line materials formed by sputtering method;

DETAILED DESCRIPTION OF THE PREFERRED EMBODIMENTS

Figure 1:
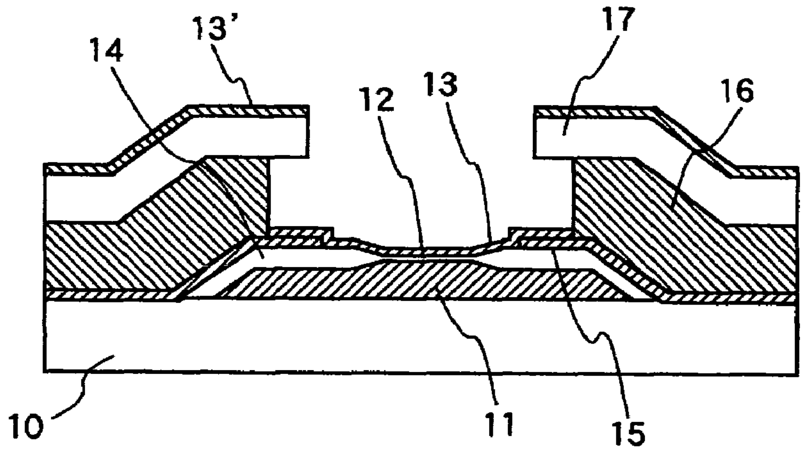
FIG. 1 is a drawing to show a structure of elements of a thin-film type electron source.
Figure 2:
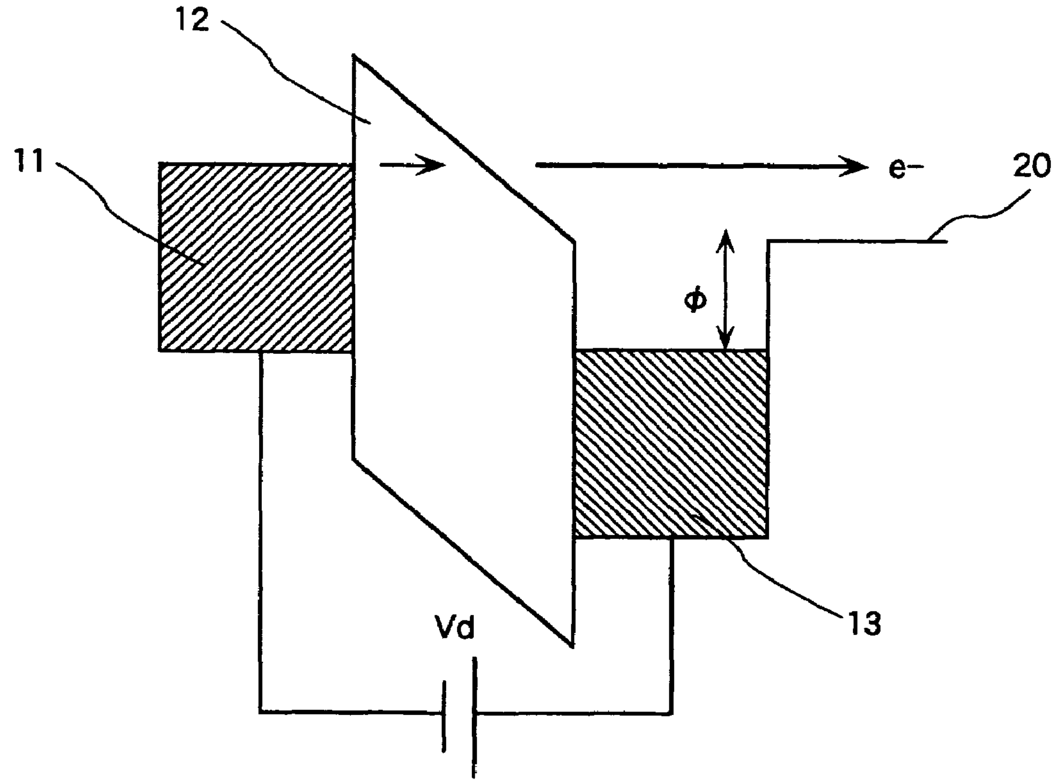
FIG. 2 is a drawing to explain operating principle of the thin-film type electron source.

Detailed description will be given below on embodiments of the present invention referring to the drawings. The description will be given, as an example, on an image display device of field emission type using MIM type thin-film electron source of hot electron emission type. However, it is needless to say that the present invention is not limited to the image display device using MIM type electron source, and the invention can be applied in similar manner to various types of image display devices using different types of electron sources as explained in the Background of the Invention.

Embodiment 1

Figure 3:
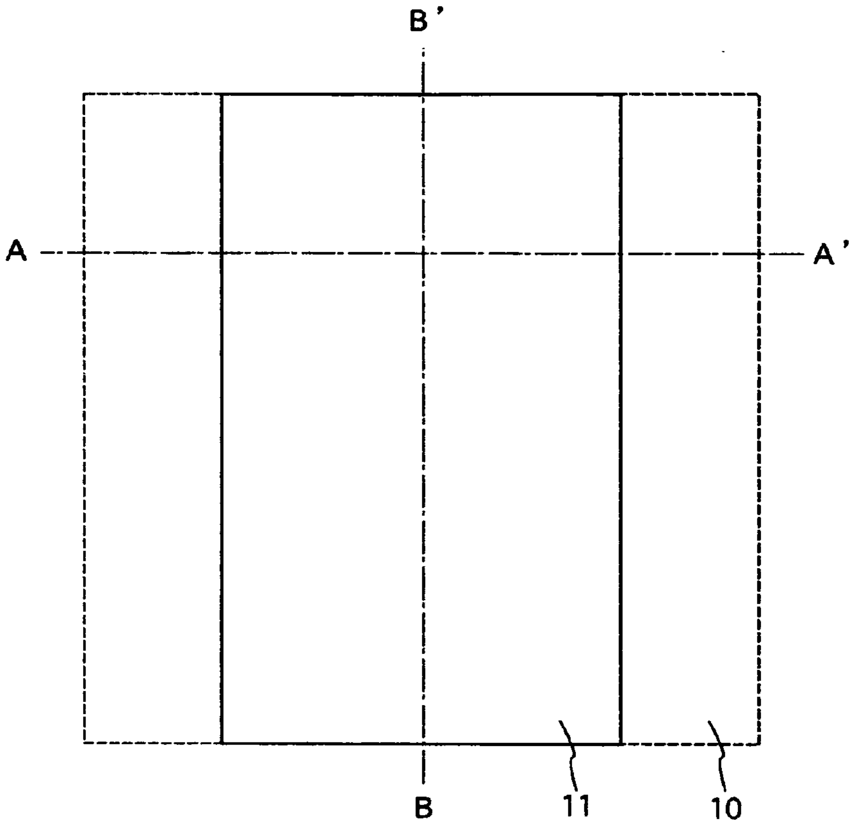
FIG. 3 represents drawings to explain a method for manufacturing the thin-film type electron source in Embodiment 1 of the present invention.
Figure 3:
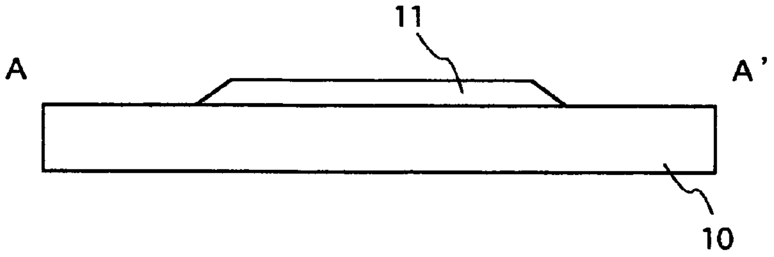
Figure 3:
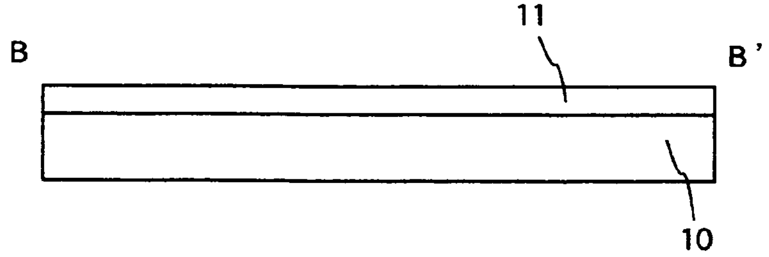
Figure 4:
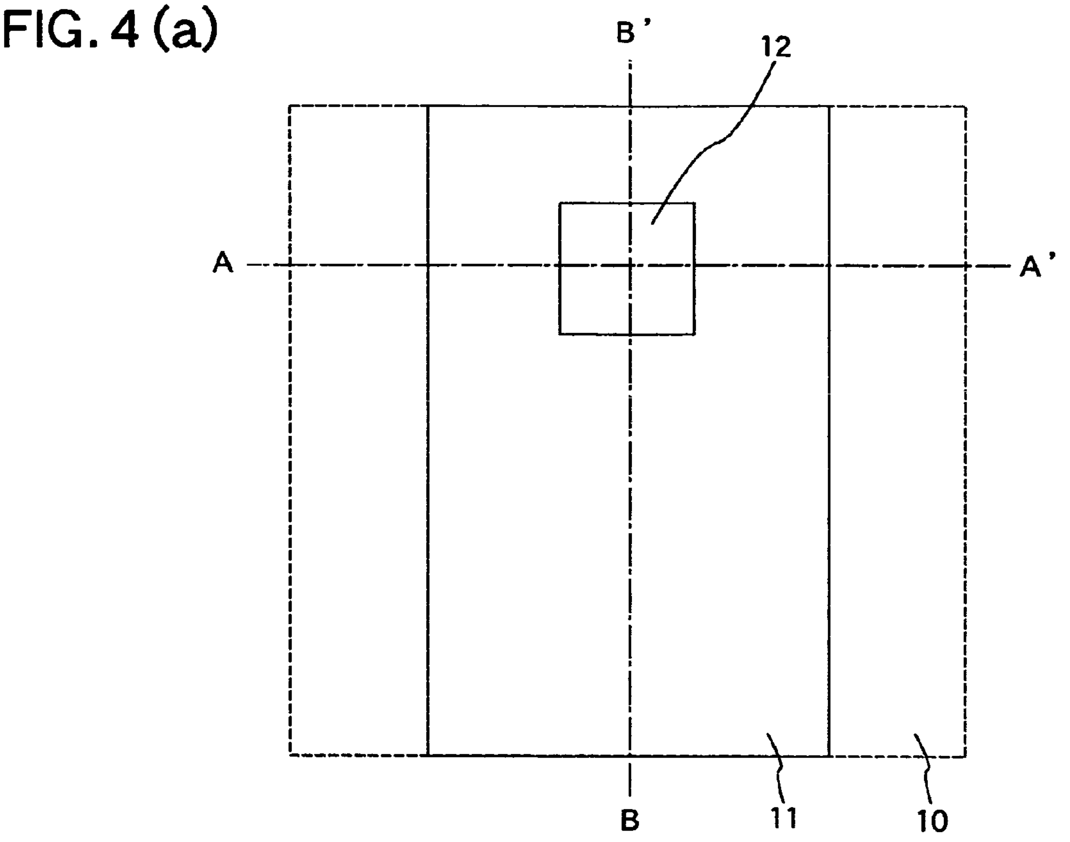
FIG. 4 represents drawings similar to those of FIG. 3 to explain the method for manufacturing the thin-film type electron source in Embodiment 1 or the present invention.
Figure 4:
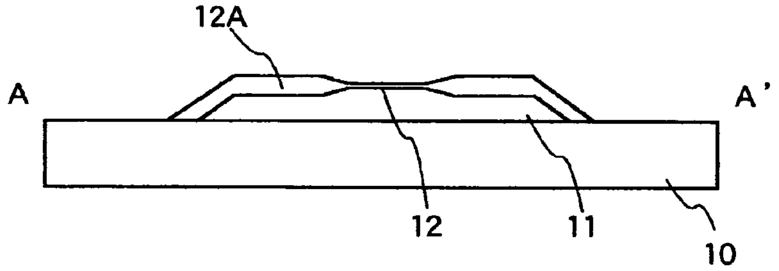
Figure 4:
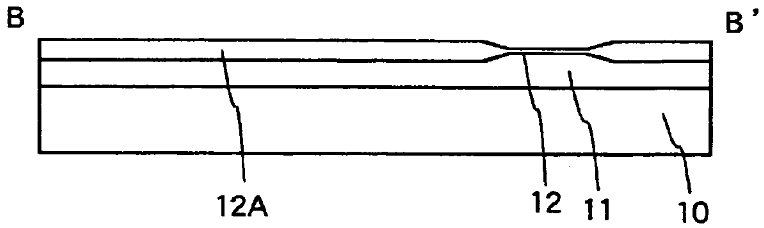
Figure 5A:
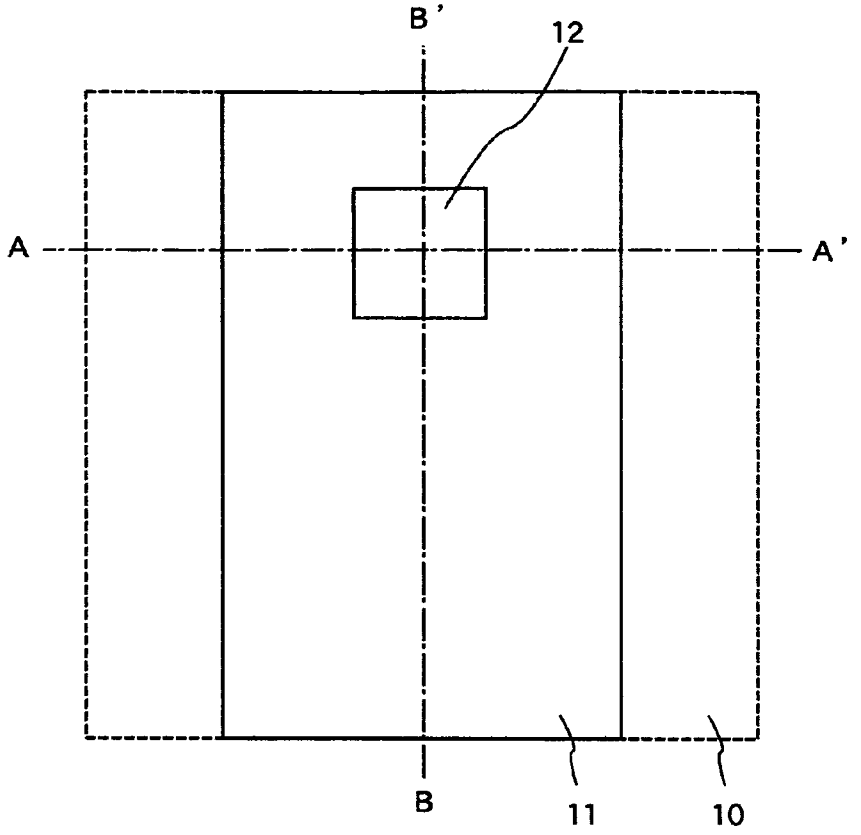
FIG. 5 represents drawings similar to those of FIG. 4 to explain the method for manufacturing the thin-film type electron source in Embodiment 1 or the present invention.
Figure 5B:
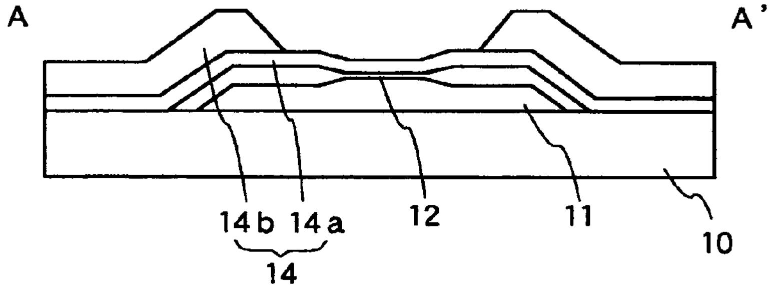
Figure 5C:
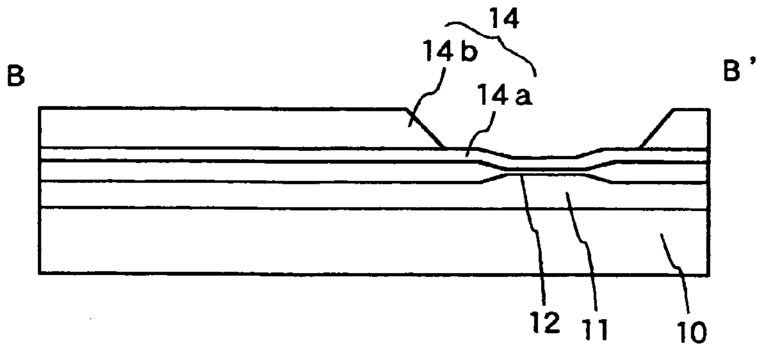
Figure 9:
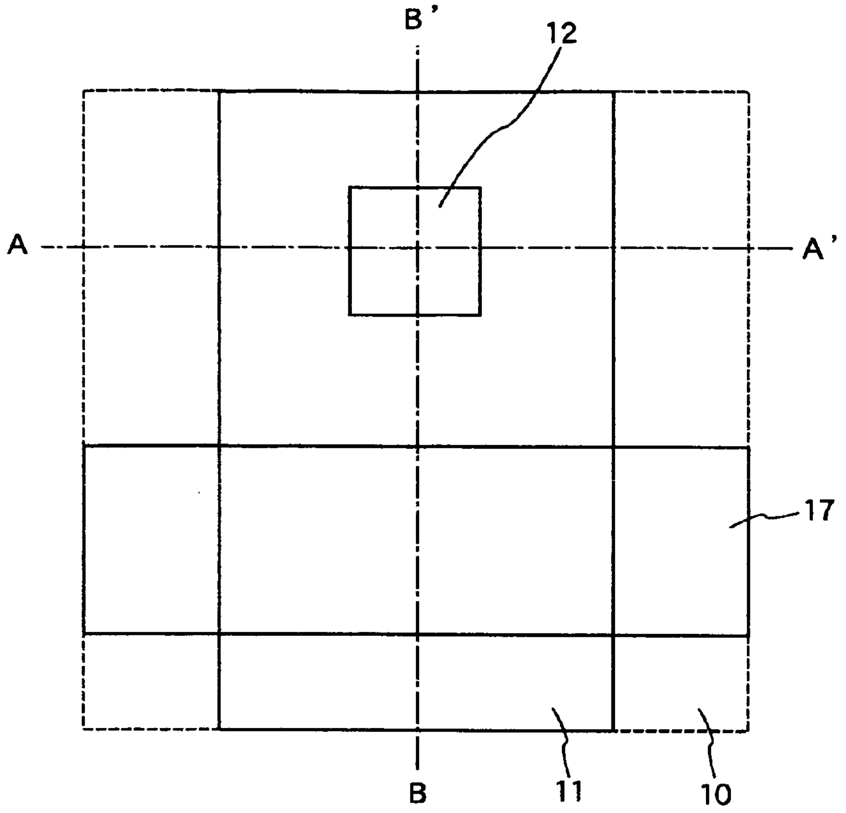
FIG. 9 represents drawings similar to those of FIG. 8 to explain the method for manufacturing the thin-film type electron source in Embodiment 1 or the present invention.
Figure 9:
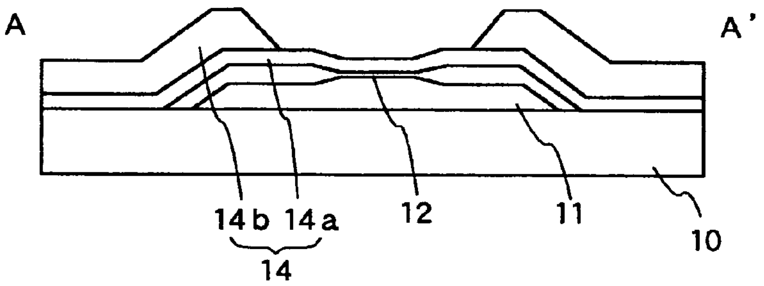
Figure 9:
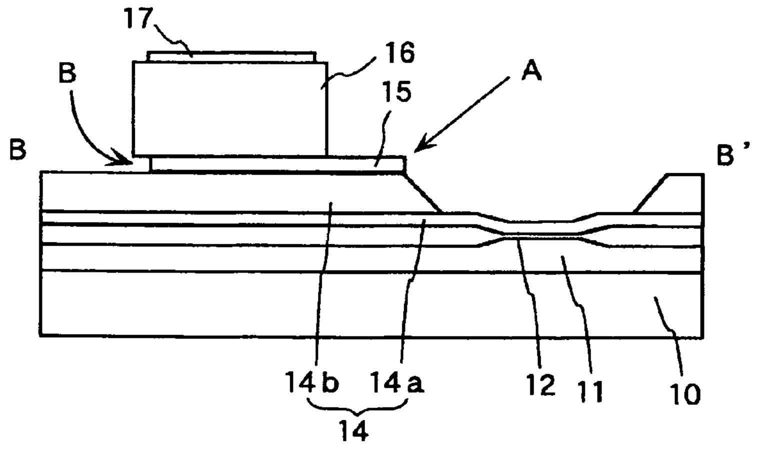
Figure 10A:
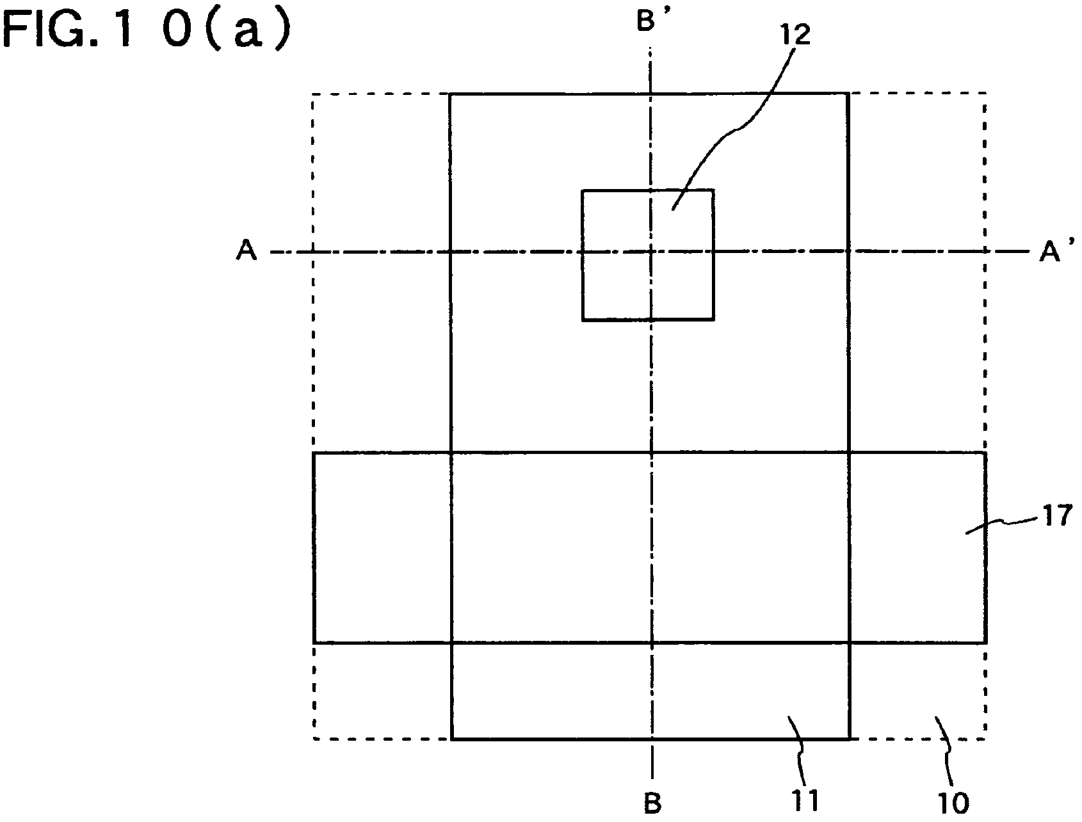
FIG. 10 represents drawings similar to those of FIG. 9 to explain the method for manufacturing the thin-film type electron source in Embodiment 1 or the present invention.
Figure 10B:
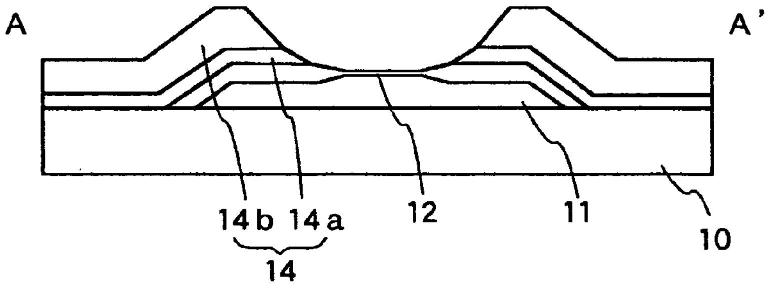
Figure 10C:
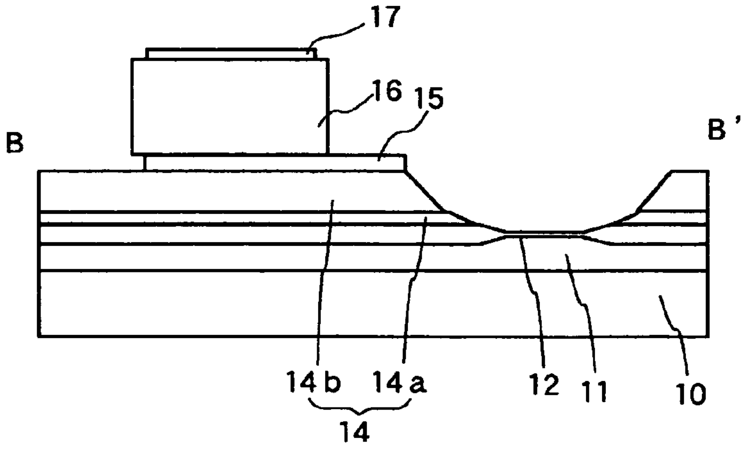
Figure 11:
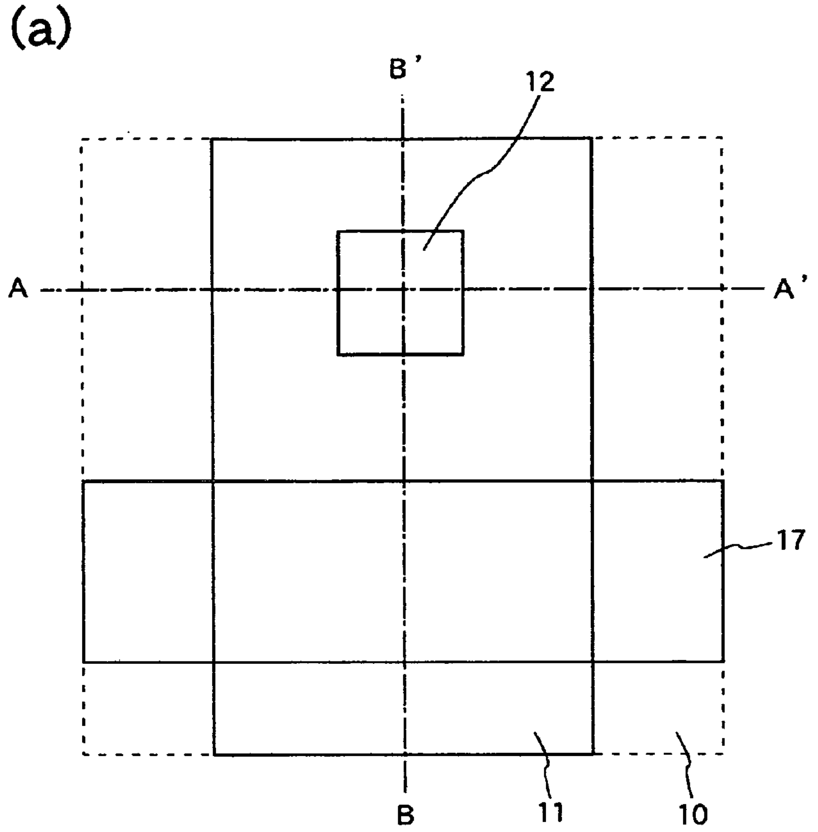
FIG. 11 represents drawings similar to those of FIG. 10 to explain the method for manufacturing the thin-film type electron source in Embodiment 1 or the present invention.
Figure 11:
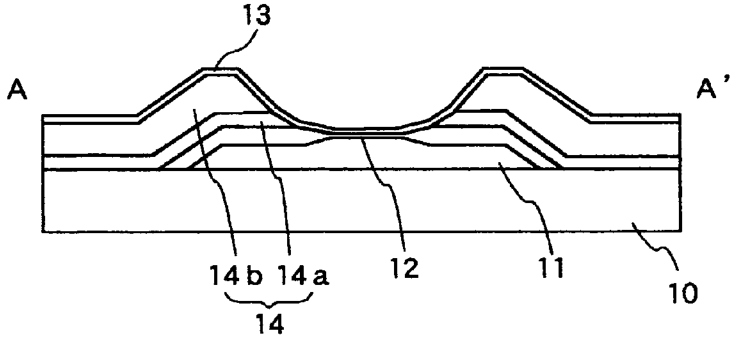
Figure 11:
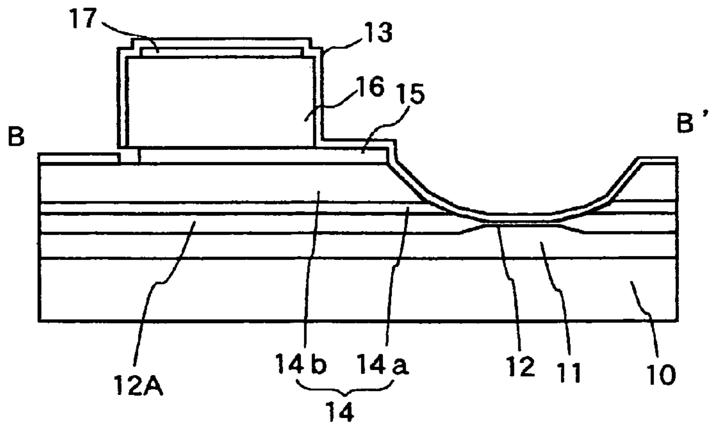

Description will be given below on an arrangement of Embodiment 1 referring to the drawings of manufacturing processes as shown in FIG. 3 to FIG. 11. FIG. 3 to FIG. 11 each represents process drawings to explain Embodiment 1 of the image display device according to the present invention. FIG. 4 represents process drawings similar to those of FIG. 3, FIG. 5 represents process drawings similar to those of FIG. 4, and so on . . . and FIG. 11 represents process drawings similar to those of FIG. 10. Here, a manufacturing method is disclosed on a case where insulating film of coating type has photosensitive property and re-flowing does not occur due to heat treatment during the manufacturing process after the formation of the pattern.

In FIG. 3, a metal film for a bottom electrode 11 is deposited on a cathode substrate 10 made of insulating material such as glass. As the material for the bottom electrode, aluminum (Al) or aluminum alloy is used. An Al—Nd alloy obtained from aluminum doped with neodymium (Nd) by 2 atom % is used. For the deposition of this metal film, sputtering method is adopted, for instance. Film thickness is set to 300 nm. After the film deposition, the bottom electrode 11 in stripe-like form as shown in FIG. 3 is formed by photolithography process and etching process. Wet etching is adopted using a mixed aqueous solution of phosphoric acid, acetic acid, and nitric acid as the etching solution, for instance.

In FIG. 4, a resist pattern is placed on a part of the bottom electrode, and the surface is locally processed by anodic oxidation. For example, if the processing voltage is set to 100 V, an insulating layer of about 140 nm in thickness is formed on the bottom electrode 11. Next, the resist pattern used for anodic oxidation is peeled off, and the surface of the bottom electrode 11 is processed again by anodic oxidation. For instance, when processing voltage is set to 6 V, an insulating layer (tunneling insulator)of about 13 nm in thickness is formed on the bottom electrode 11. Around the tunneling insulator 12, a field insulator 12A is prepared. In this case, oxidation is not performed on a region where an oxide film of 100 V has already grown, and the oxide film grows only on the region, which has been covered with the resist in the preceding process.

In FIG. 5, silicon nitride (e.g. $Si_3N_4$), silicon oxide (e.g. $SiO_2$), or mixture of these two ($Si_xO_yN_z$) is formed by the sputtering method as a lower layer 14*a* of the interlayer insulator 14. Next, an insulating film is formed by coating as an upper layer 14*b* of the interlayer insulator. As the material, SOG, inorganic polysilazane or organic polysilazane is suitable. Preferably, a material with photosensitive property should be used.

After a coating film is deposited on the substrate by spin coating method, light exposure is performed using a photomask with a desired pattern, and the pattern is formed by alkali developing process. Then, temporary firing is carried out in the atmospheric air. In this case, it is preferable to set the firing temperature to 300° C. or lower, or more preferably to about 200° C. so that Al—Nd alloy may not be deposited on the bottom electrode 11. In case the material has no photosensitive property, a photoresist pattern should be put, and a desired pattern should be formed by dry etching using flon (chlorofuorocarbon) type gas, e.g. a mixed gas of $CF_4$ and $O_2$.

Figure 6:
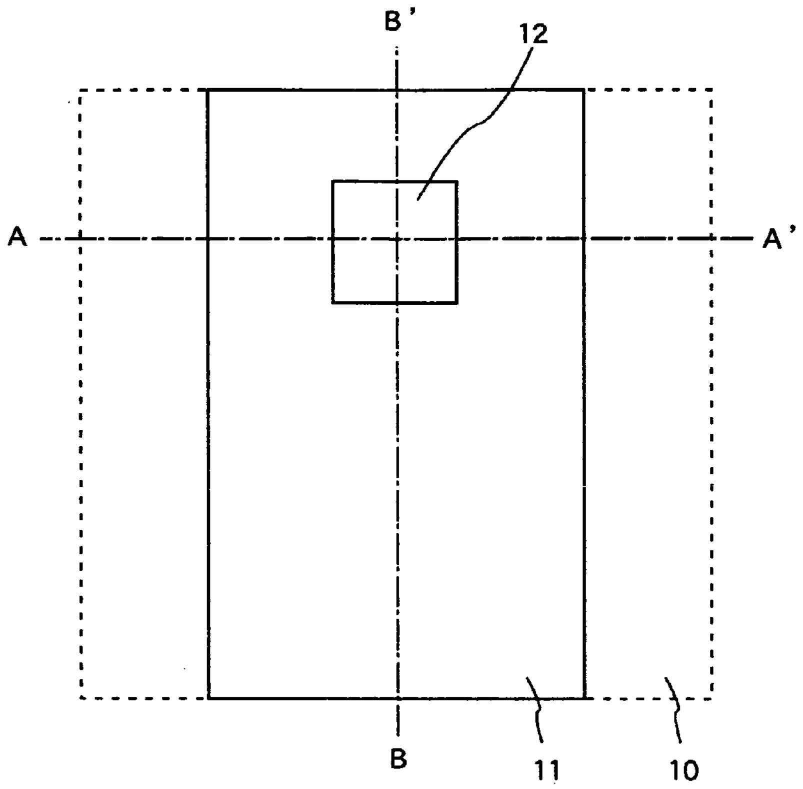
FIG. 6 represents drawings similar to those of FIG. 5 to explain the method for manufacturing the thin-film type electron source in Embodiment 1 or the present invention.
Figure 6:
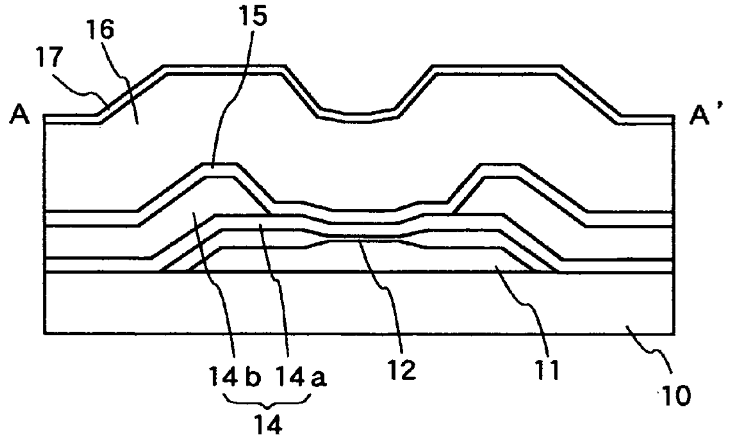
Figure 6:
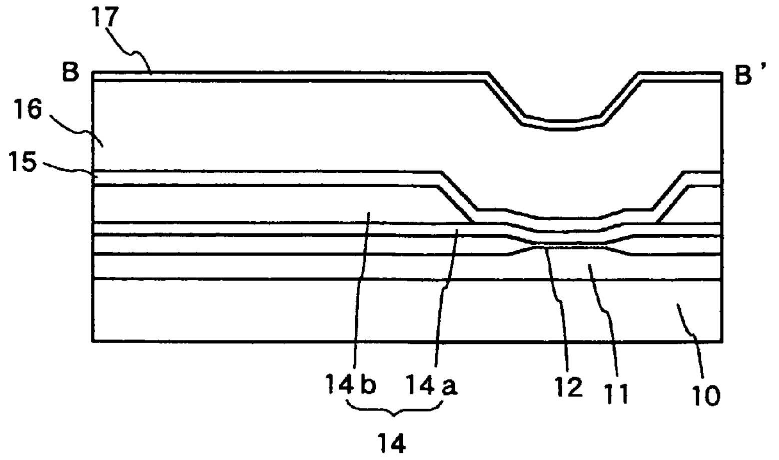

In FIG. 6, chromium (Cr) is formed in thickness of 100 nm as a contact electrode 15. Also, aluminum alloy as described above is formed in thickness of 2 μm as a top electrode bus line (top electrode bus line; scan line bus line) 16, and chromium (Cr) is formed in thickness of 50 nm as a cap electrode 17 on it.

Figure 7:
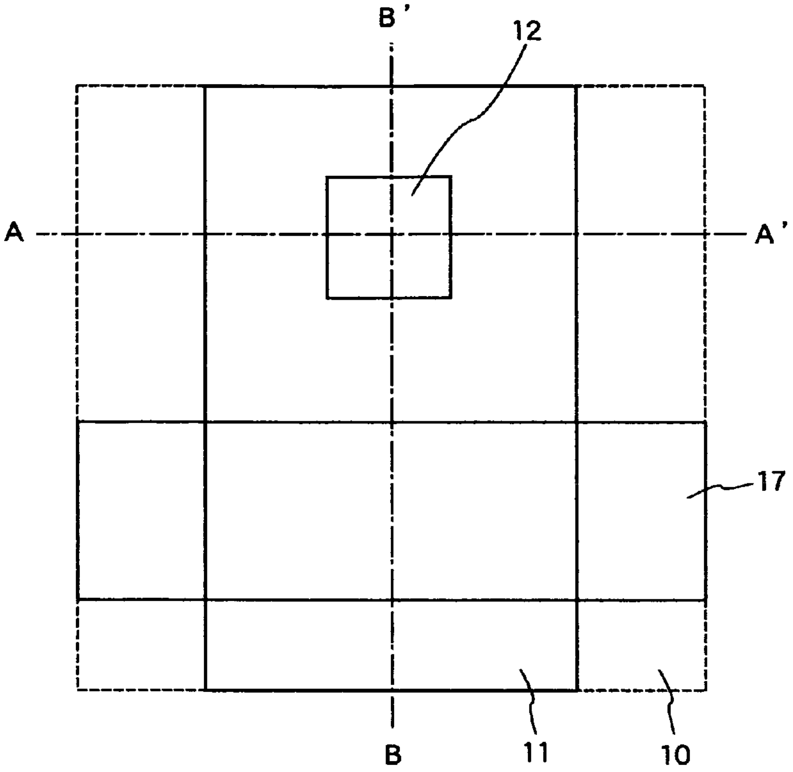
FIG. 7 represents drawings similar to those of FIG. 6 to explain the method for manufacturing the thin-film type electron source in Embodiment 1 or the present invention.
Figure 7:
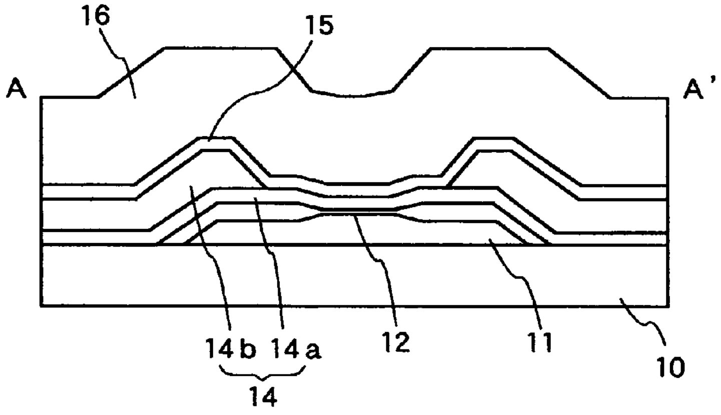
Figure 7:
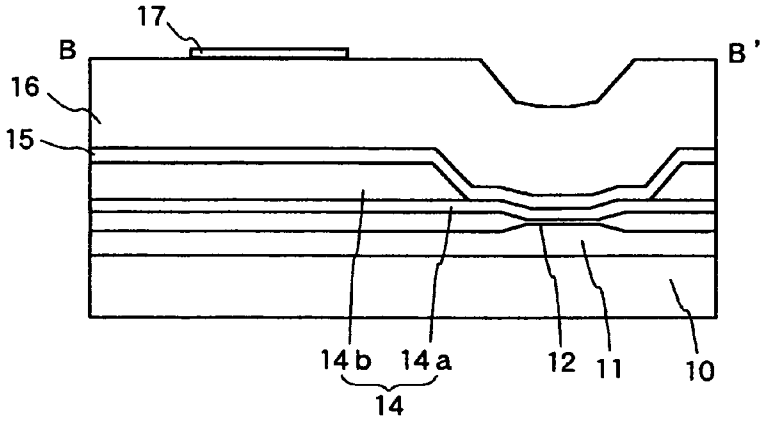

In FIG. 7, chromium of the cap electrode 17 is left on a portion serving as the scan line. For the etching of Cr, a mixed aqueous solution of cerium diammonium nitrate and nitric acid is suitable. In this case, it is necessary to design in such manner that line width of the cap electrode 17 is narrower than line width of the top electrode bus line 16 to be manufactured in the subsequent process. This is because the top electrode bus line 16 is made of aluminum alloy of 2 μm in thickness and the side etching of the same extent inevitably occurs due to the wet etching. If proper consideration is not given on this point, the cap electrode 17 may protrude in form of an eave from the top electrode bus line 16. The portion protruded in form of eave of the cap electrode 17 is poor in strength and is very likely to collapse during the manufacturing process or may be peeled off, causing short-circuit between bus lines or may induce serious arc discharge because electrostatic focusing occurs when high voltage is applied.

Figure 8:
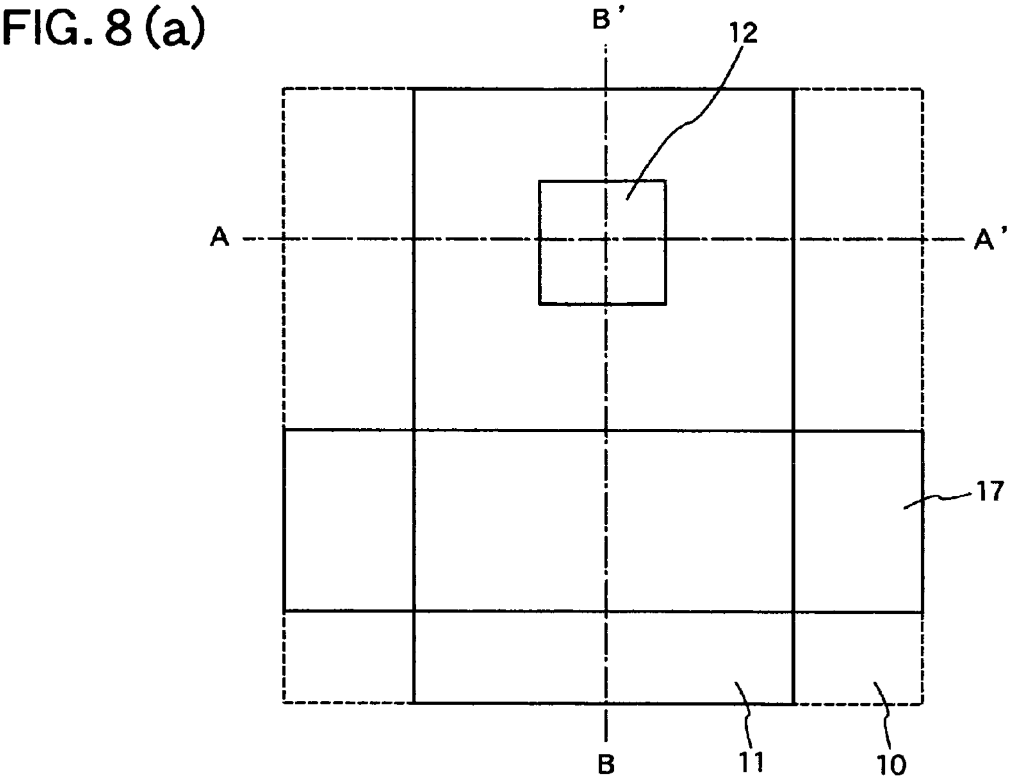
FIG. 8 represents drawings similar to those of FIG. 7 to explain the method for manufacturing the thin-film type electron source in Embodiment 1 or the present invention.
Figure 8:
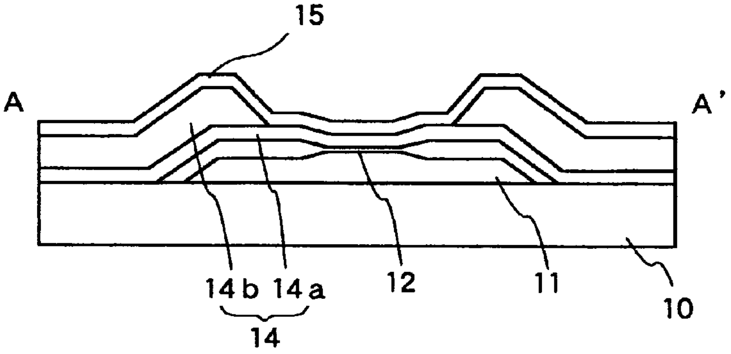
Figure 8:
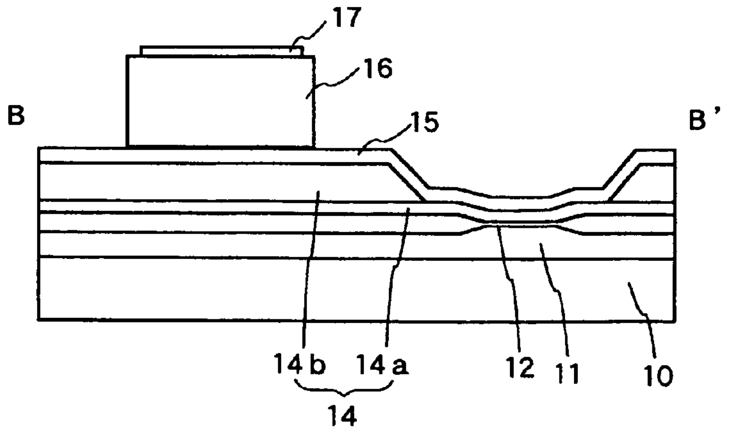

In FIG. 8, the top electrode bus line 16 is processed in stripe-like form in a direction perpendicularly crossing the bottom electrode 11. As the etching solution, a mixed aqueous solution of phosphoric acid, acetic acid, and nitric acid (PAN) is suitable, for instance.

In FIG. 9, the contact electrode 15 is processed so that it is protruded toward the opening of the interlayer insulator 14 and that it is retracted with respect to the top electrode bus line 16 (to form an undercut) on the opposite side. For this purpose, a photoresist pattern should be placed on the contact electrode 15 in the former case. It should be placed on the cap electrode 17 in the latter case, and wet etching should be performed. As the etching solution, a mixed aqueous solution of cerium diammonium nitrate as described above is suitable. In this case, the lower layer 14*a* of the interlayer insulator plays a role of an etching stopper to protect the tunneling insulator 12 from the etching solution.

In FIG. 10, to provide an electron emission region, an opening is formed on a part of the interlayer insulator 14 by photolithography and dry etching. As the etching gas, mixed gas of $CF_4$ and $O_2$ is suitable. The exposed tunneling insulator 12 is again processed by anodic oxidation to repair the damage caused by the processing.

In FIG. 11, the top electrode 13 is formed, and the cathode substrate (electron source substrate) is completed. For film deposition on the top electrode 13, a shadow mask is used, and the sputtering method is performed so that film may not be deposited on terminal of electric wiring around the substrate. The top electrode bus line 16 may be poorly covered on the undercut structure as described above, and the top electrode 13 may be automatically separated for each scan line. As the material of the top electrode 13, a laminated film of Ir, Pt and Au is used, and the thickness of the film is set to several nm. As a result, it is possible to avoid contamination and damage to the top electrode 13 and the tunneling insulator 12 caused by photolithography and etching.

Embodiment 2

Figure 12A:
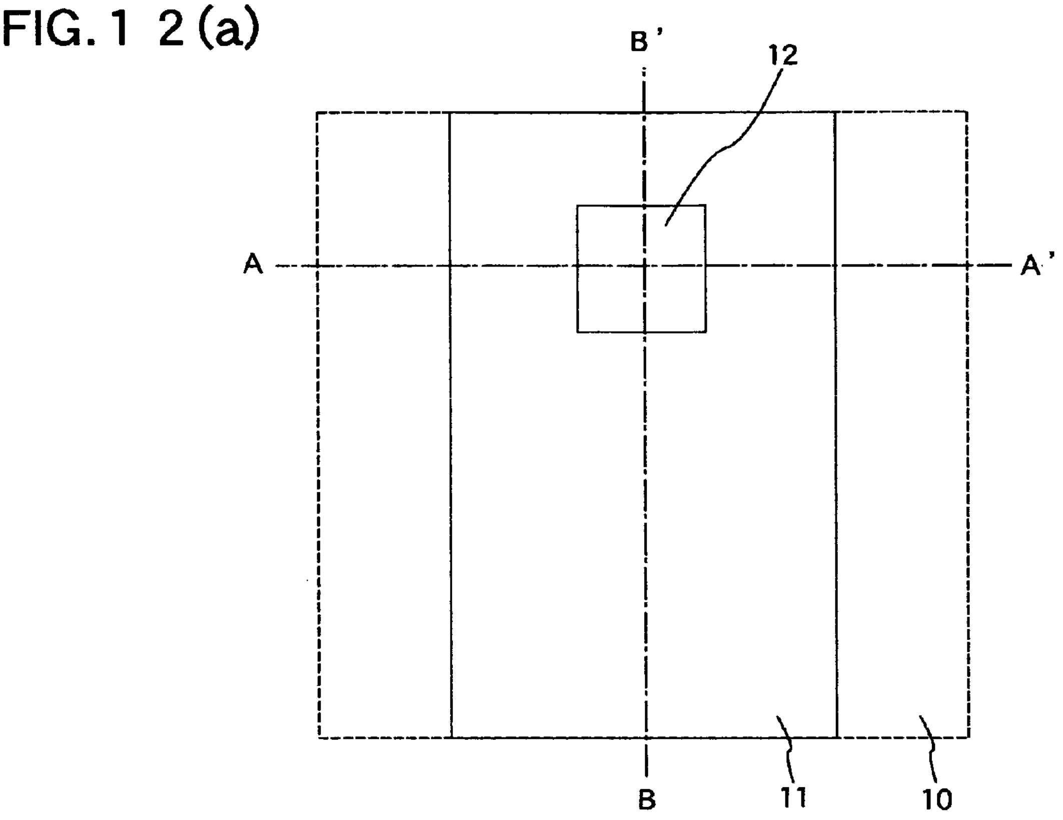
FIG. 12 represents drawings to explain a method for manufacturing the thin-film type electron source in Embodiment 2 of the present invention.
Figure 12B:
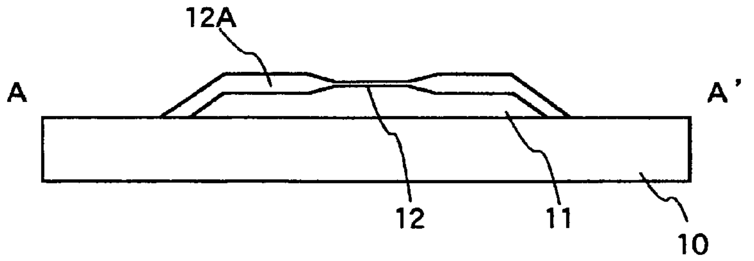
Figure 12C:
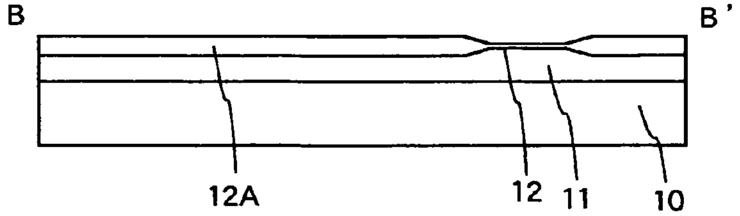
Figure 13A:
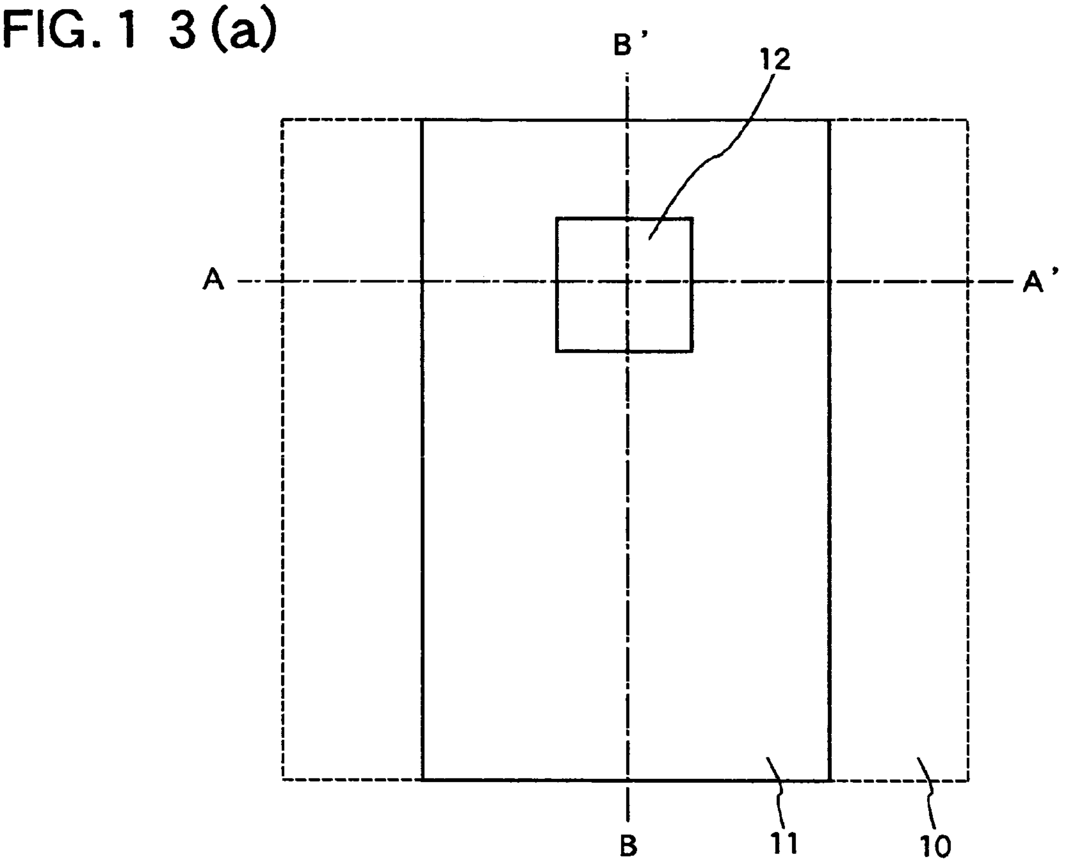
FIG. 13 represents drawings similar to those of FIG. 12 to explain the method for manufacturing the thin-film type electron source in Embodiment 2 of the present invention.
Figure 13B:
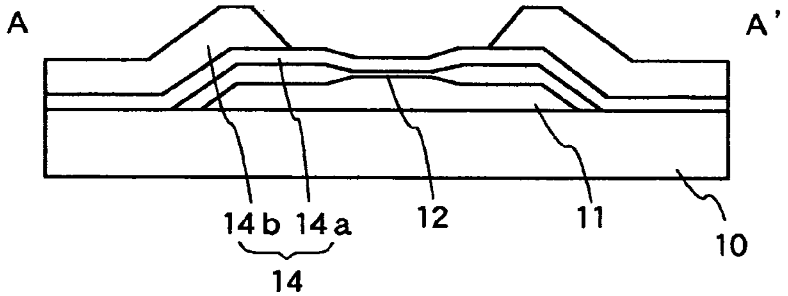
Figure 13C:
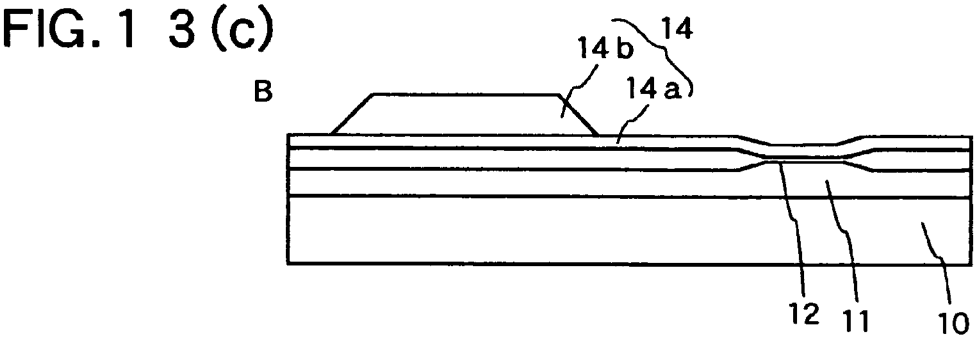
Figure 14A:
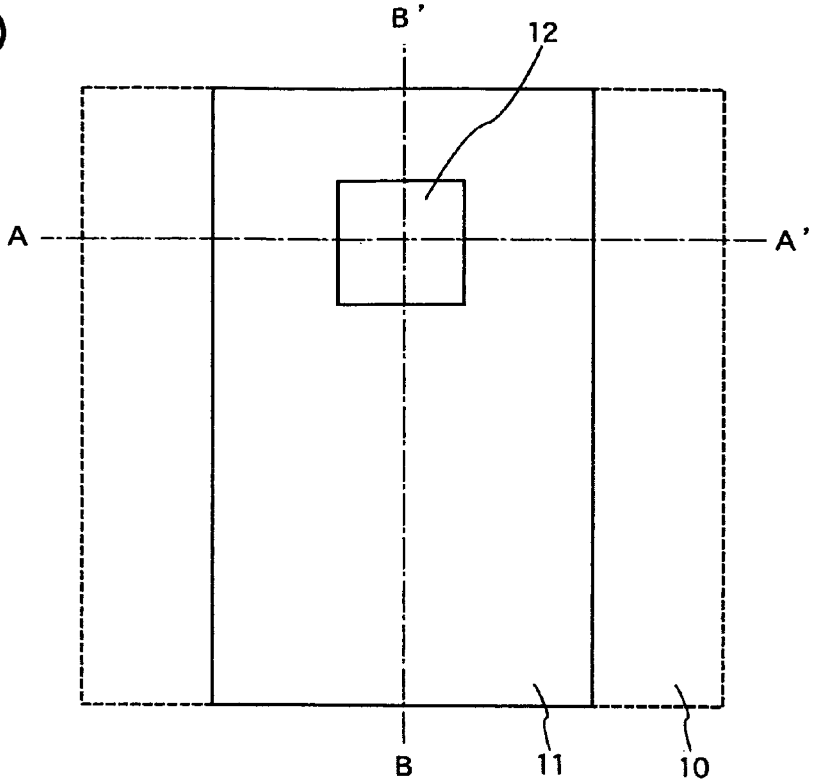
FIG. 14 represents drawings similar to those of FIG. 13 to explain the method for manufacturing the thin-film type electron source in Embodiment 2 of the present invention.
Figure 14B:
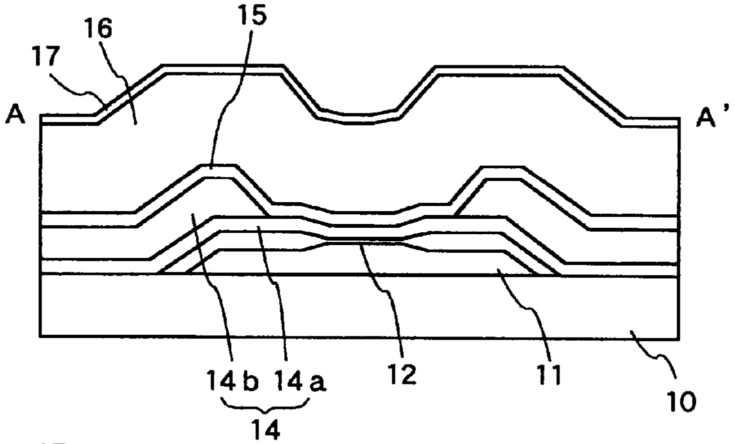
Figure 14C:
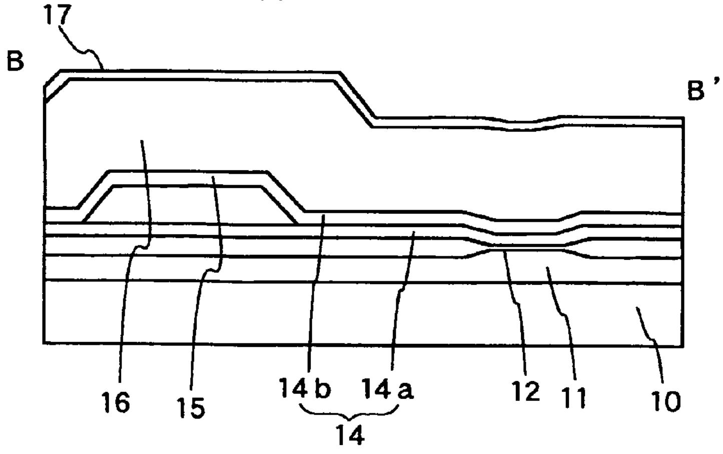

Description will be given below on the image display device of Embodiment 2 referring to FIG. 12 to FIG. 19. FIG. 12 to FIG. 19 each represents process drawings to explain Embodiment 2 of the image display device according to the present invention. FIG. 13 represents process drawings similar to those of FIG. 12, FIG. 14 represents process drawings similar to those of FIG. 13, and so on, . . . and FIG. 19 represents process drawings similar to those of FIG. 18. Here, a manufacturing method is disclosed on a case where the insulating film of coating type has photosensitive property and re-flowing occurs due to heat treatment during the manufacturing process after the formation of the pattern. First, according to the manufacturing procedure similar to that of Embodiment 1, the bottom electrode 11, the tunneling insulator 12, and the field insulator 12A are prepared (FIG. 12).

In FIG. 13, silicon nitride ($Si_3N_4$), silicon oxide ($SiO_2$), or mixture of these two (SiON) is formed by the sputtering method as a lower layer 14*a* of the interlayer insulator 14. Next, as an upper layer 14*b* of the interlayer insulator 14, an insulating film is formed by coating film deposition. As the material, SOG, inorganic polysilazane or organic polysilazane is suitable. More preferably, a material with photosensitive property should be used.

After a coating film is formed on the substrate by spin coating method, light exposure is performed using a photomask with a desired pattern, and a pattern is formed by alkali developing process. Then, temporary firing is carried out in the atmospheric air. It is preferable that the firing temperature is set to 300° C. or lower, or more preferably, to about 200° C. so that Al—Nd alloy may not be deposited on the bottom electrode. In case the material has no photosensitive property, a photoresist pattern is placed after temporary firing, and the opening should be formed by dry etching using flon type gas as described above.

In FIG. 14, chromium (Cr) is formed in thickness of 100 nm as a contact electrode 15. Also, aluminum alloy as described above is formed in thickness of 2 μm as a top electrode bus line (top electrode bus line; scan line bus line) 16, and chromium (Cr) is formed in thickness of 50 nm as a cap electrode 17 on it.

Figure 15A:
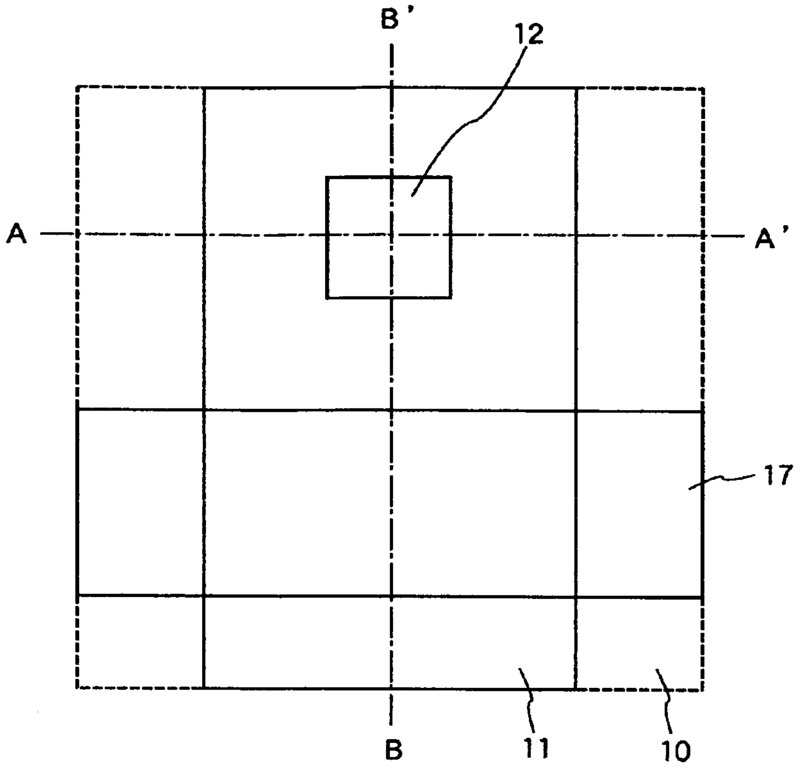
FIG. 15 represents drawings similar to those of FIG. 14 to explain the method for manufacturing the thin-film type electron source in Embodiment 2 of the present invention.
Figure 15B:
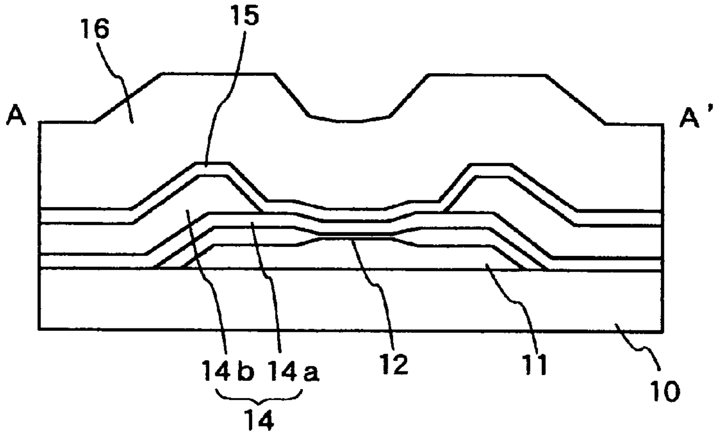
Figure 15C:
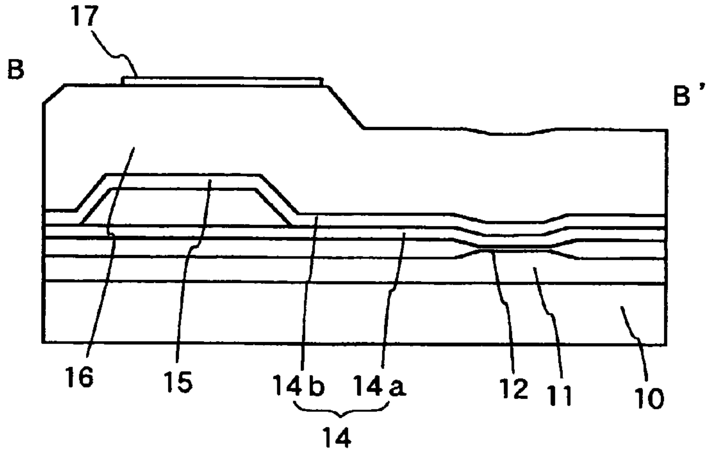

In FIG. 15, chromium of the cap electrode 17 is left on a portion serving as the scan line. For the etching of Cr, a mixed aqueous solution of cerium diammonium nitrate and nitric acid is suitable. In this case, it is necessary to design in such manner that line width of Cr is narrower than line width of the top electrode bus line 16 to be manufactured in the subsequent process. This is because the top electrode bus line 16 is made of aluminum alloy of 2 μm in thickness and the side etching of the same extent inevitably occurs due to the wet etching. If proper consideration is not given on this point, the cap electrode 17 may protrude in form of an eave from the top electrode bus line 16. The portion protruded in form of eave of the cap electrode 17 is poor in strength and is very likely to collapse during the manufacturing process or may be peeled off, causing short-circuit between bus lines or may induce serious arc discharge because electrostatic focusing occurs when high voltage is applied.

Figure 16:
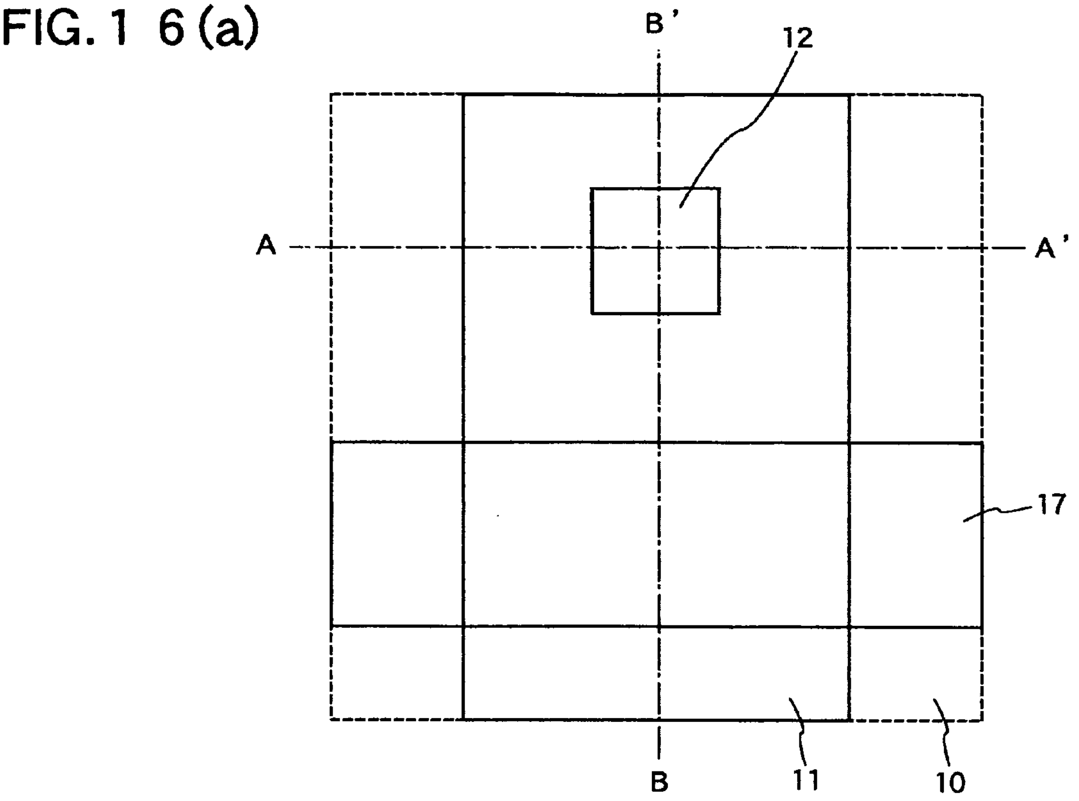
FIG. 16 represents drawings similar to those of FIG. 15 to explain the method for manufacturing the thin-film type electron source in Embodiment 2 of the present invention.
Figure 16:
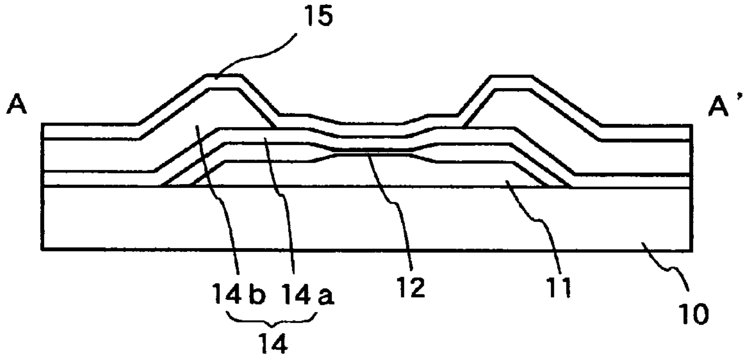
Figure 16:
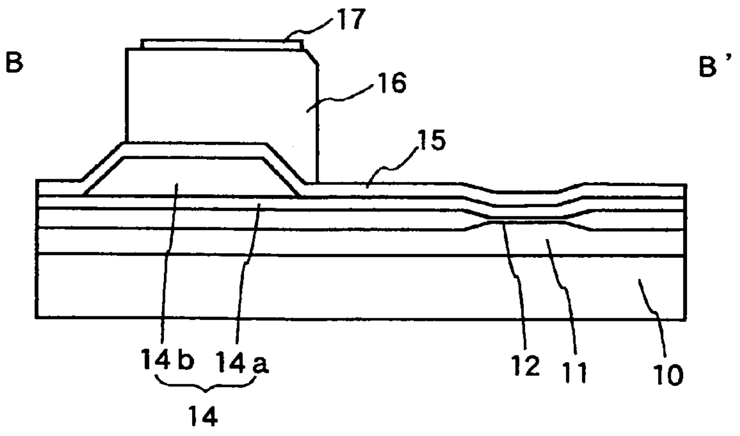

In FIG. 16, the top electrode bus line 16 is processed in stripe-like form in a direction perpendicularly crossing the bottom electrode 11. As the etching solution, a mixed aqueous solution of phosphoric acid, acetic acid, and nitric acid (PAN) is suitable, for instance. In this case, it is important that positional relation between the opening of the interlayer insulator and the top electrode bus line 16 is different from that of Embodiment 1, and that the patterning of the electrode is designed to stretch over the opening.

Figure 17A:
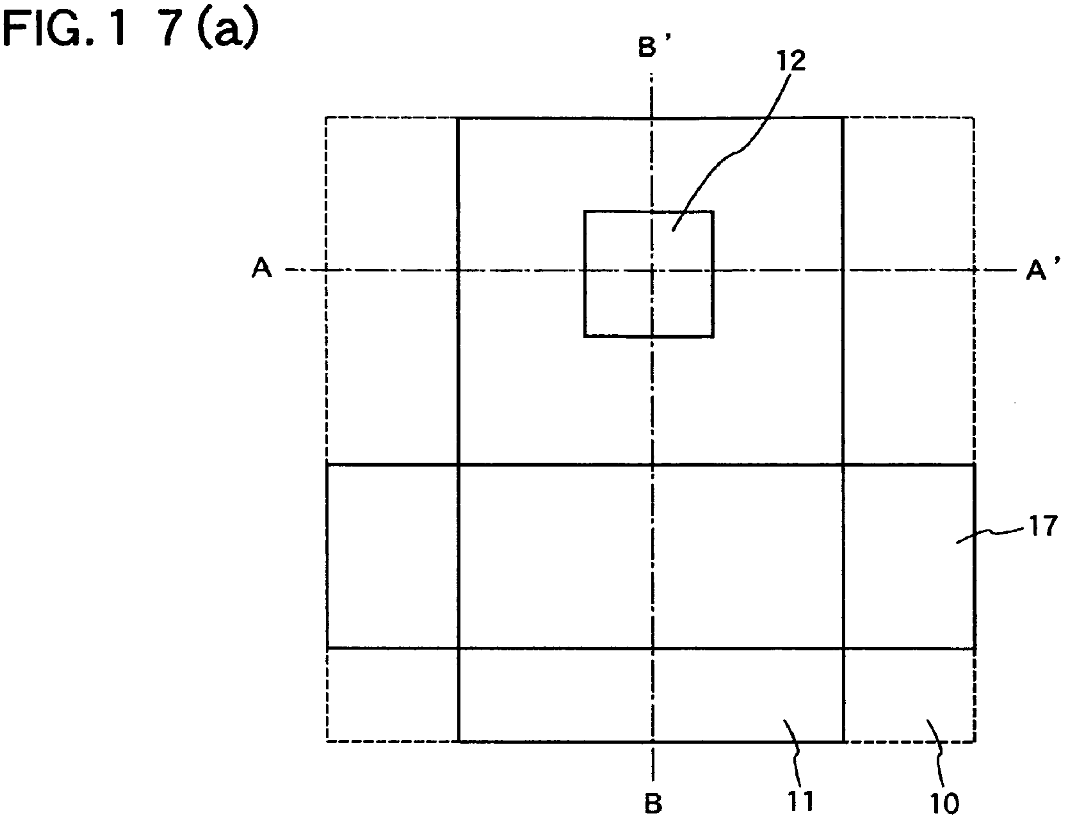
FIG. 17 represents drawings similar to those of FIG. 16 to explain the method for manufacturing the thin-film type electron source in Embodiment 2 of the present invention.
Figure 17B:
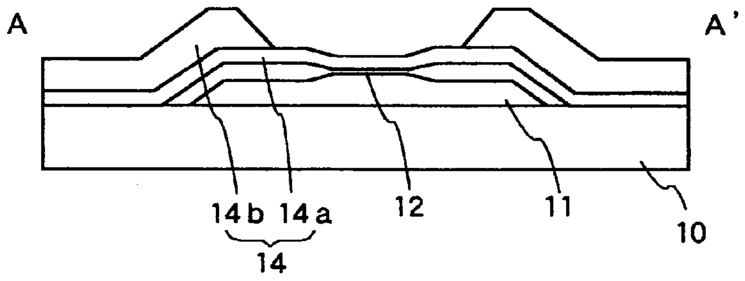
Figure 17C:
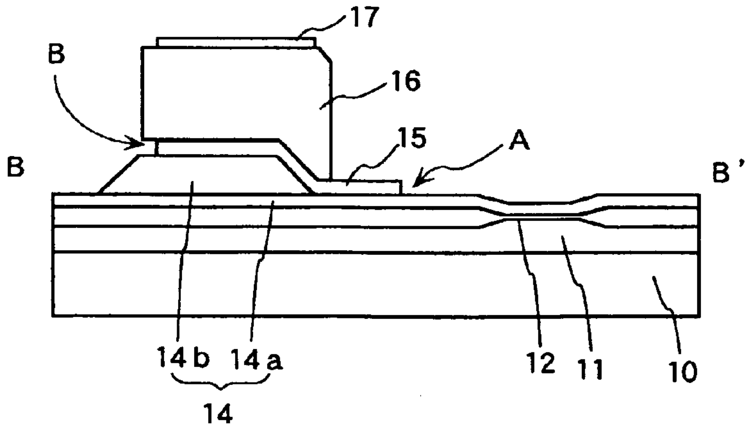

In FIG. 17, the contact electrode 15 is processed so that it is protruded toward the opening (arrow A) of the interlayer insulator 14 and that it is retracted with respect to the top electrode bus line 16 (to form an undercut) on the opposite side (arrow B). For this purpose, a photoresist pattern should be placed on the contact electrode 15 in the former case. It should be placed on the cap electrode 17 in the latter case, and wet etching should be performed. As the etching solution, a mixed aqueous solution of cerium diammonium nitrate as described above is suitable. In this case, the lower layer 14*a* of the interlayer insulator plays a role of an etching stopper to protect the tunneling insulator 12 from the etching solution.

Figure 18A:
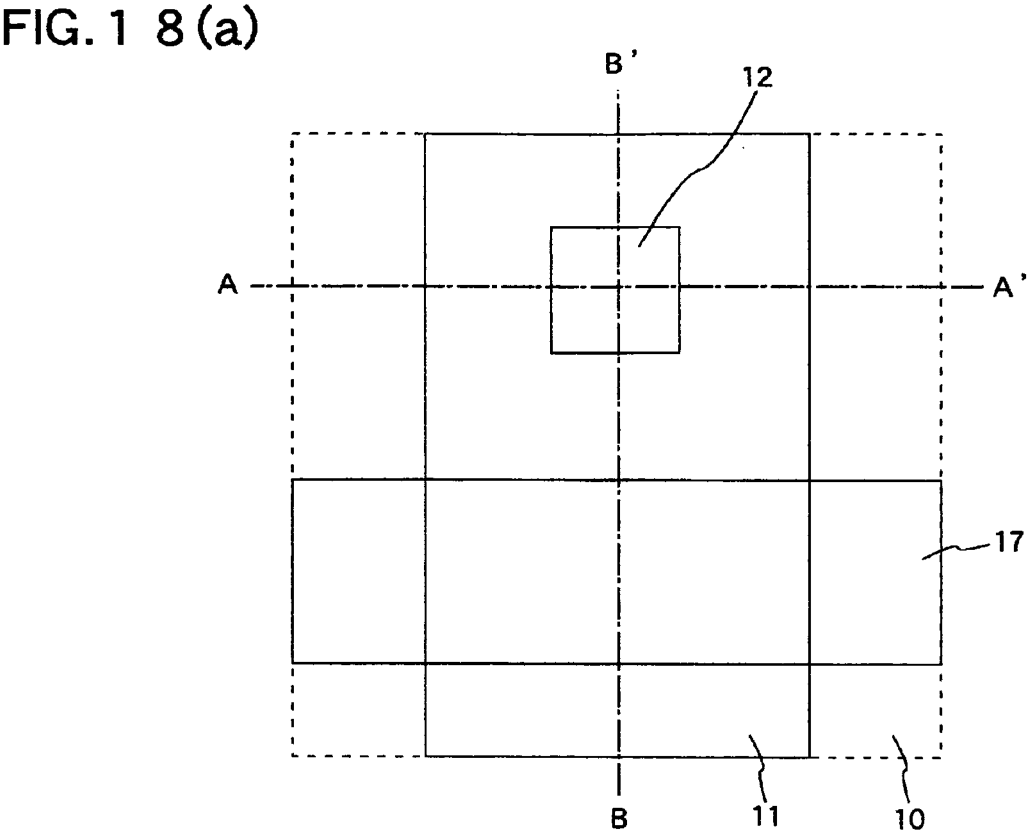
FIG. 18 represents drawings similar to those of FIG. 17 to explain the method for manufacturing the thin-film type electron source in Embodiment 2 of the present invention.
Figure 18B:
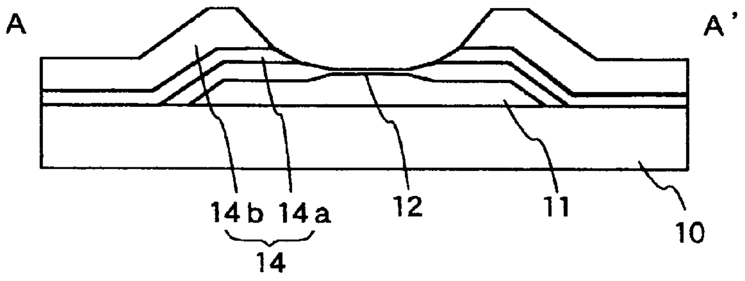
Figure 18C:
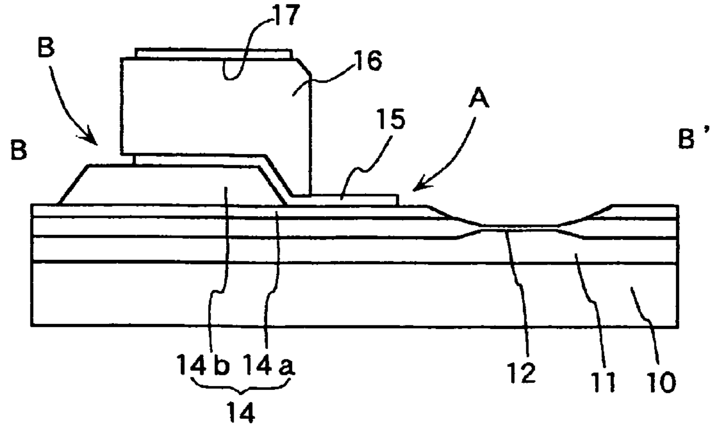
Figure 19A:
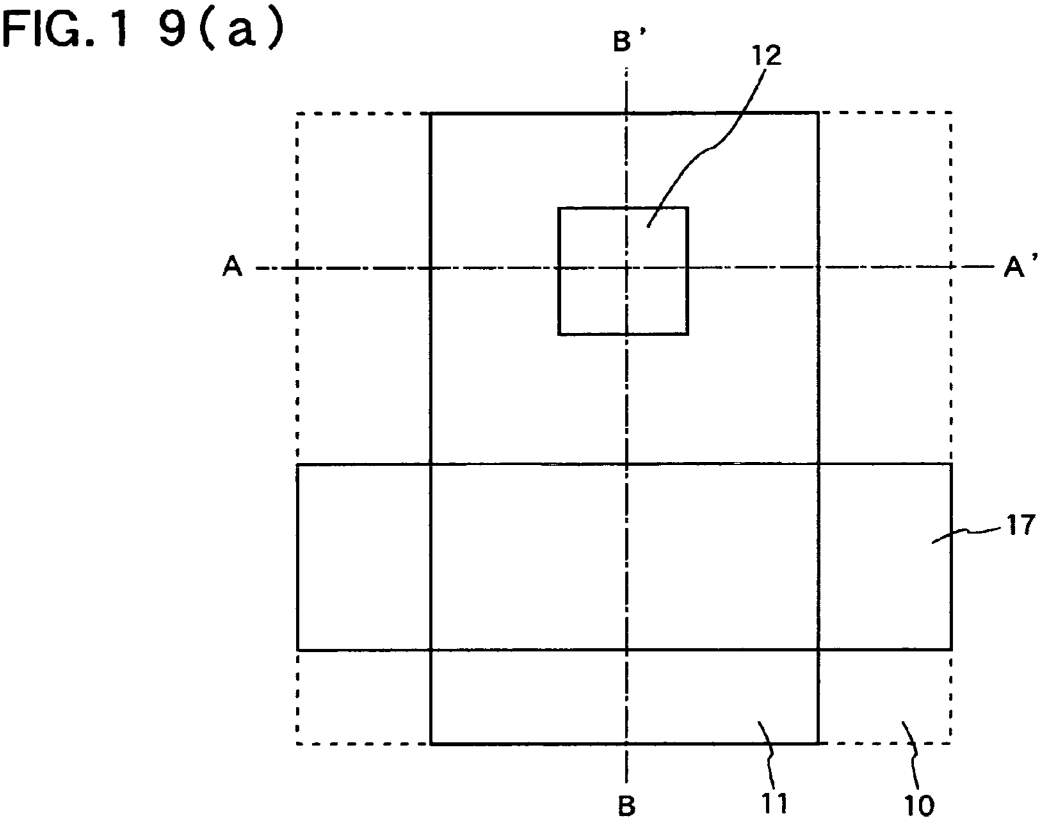
FIG. 19 represents drawings similar to those of FIG. 18 to explain the method for manufacturing the thin-film type electron source in Embodiment 2 of the present invention.
Figure 19B:
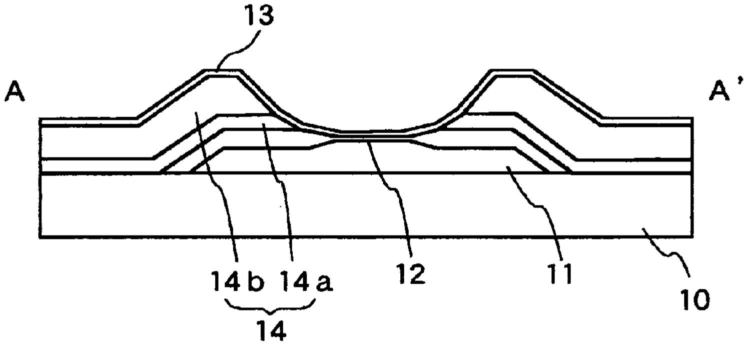
Figure 19C:
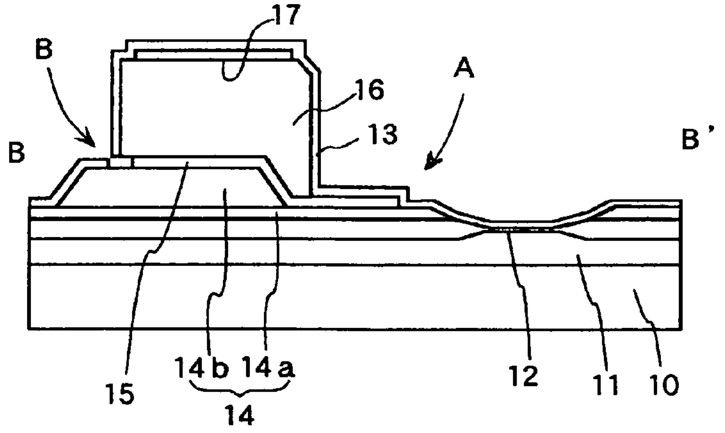

In FIG. 18, to provide an electron emission region, an opening is formed on a part of the interlayer insulator 14 by photolithography and dry etching. As the etching gas, mixed gas of $CF_4$ and $O_2$ is suitable. The exposed tunneling insulator 12 is again processed by anodic oxidation to repair the damage caused by the processing.

In FIG. 19, the top electrode 13 is formed, and the cathode substrate is completed. For film deposition on the top electrode 13, a shadow mask is used, and the sputtering method is performed so that film may not be deposited on terminal of electric wiring around the substrate. The top electrode bus line 16 may be poorly covered on the undercut structure as described above, and the top electrode 13 may be automatically separated for each scan line. In the present embodiment, it is assumed that re-flowing may occur due to heat treatment in the panel sealing process as described later—in particular, due to heat treatment during the manufacturing process of the interlayer insulator formed by coating film deposition.

On the separation side (arrow B), disconnection often occurs due to the re-flowing of the base material because the top electrode 13 above the tapered portion of the interlayer insulator 14 is extremely thin and pixel separation may be induced. On the other hand, on the connection side (arrow A), the re-flowing is suppressed because the top electrode bus line 16 is present on the tapered portion of the interlayer insulator 14, and no influence is exerted on the connection to the top electrode 13. As the material of the top electrode 13, a laminated film of Ir, Pt and Au is used, and the thickness of each film is set to several nm. As a result, it is possible to avoid contamination and damage to the top electrode or to the tunneling insulator caused by photolithography and etching. In the present embodiment, description has been given on the case where the top electrode may be poorly covered due to reverse tapered structure of the scan line pixel separation and disconnection may occur due to the re-flowing of coating type insulating film, while it would be also possible to perform pixel separation by the latter procedure only. In this case, the number of processes for the scan lines can be reduced, and this is more advantageous in terms of the manufacturing cost, the production yield, etc.

Embodiment 3

Now, description will be given on Embodiment 3 of the present invention referring to FIG. 20 to FIG. 27. FIG. 20 to FIG. 27 each represents process drawings to explain Embodiment 3 of the image display device of the present invention. FIG. 21 represents process drawings similar to those of FIG. 20, FIG. 21 represents process drawings similar to those of FIG. 21, and so on, . . . and FIG. 27 represents process drawings similar to those of FIG. 26. Here, another manufacturing method is disclosed on the case where the coating type insulating film used has photosensitive property and re-flowing occurs due to heat treatment during the manufacturing process after the formation of the pattern. First, according to the manufacturing procedure explained in the embodiment as given above, the bottom electrode 11, the tunneling insulator 12, and the field insulator 12A are prepared (FIG. 20).

In FIG. 21, an insulating film is formed by coating film deposition as a lower layer 14*a* of the interlayer insulator 14. As the material, SOG, organic polysilazane or organic polysilazane is suitable. More preferably, a material with photosensitive property should be used. After the coating film is formed on the substrate by the spin coating method, light exposure is performed using a photomask with a desired pattern, and a pattern is formed by alkali developing process. Then, temporary firing is carried out in the atmospheric air. It is preferable that the firing temperature is set to 300° C. or lower, or more preferably, to about 200° C. so that Al—Nd alloy may not be deposited on the bottom electrode 11. In case the material has no photosensitive property, a photoresist pattern is placed after temporary firing, and the opening should be formed by dry etching using flon type gas.

Figure 22A:
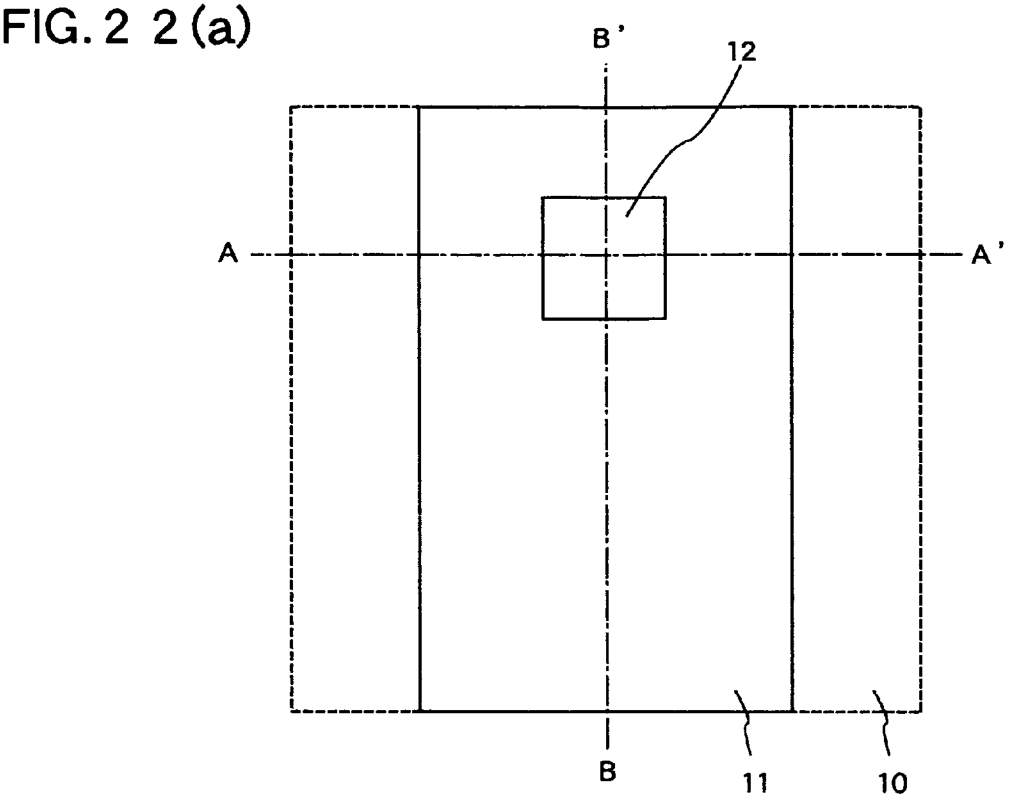
FIG. 22 represents drawings similar to those of FIG. 21 for manufacturing the thin-film electron source in Embodiment 3 of the present invention.
Figure 22B:
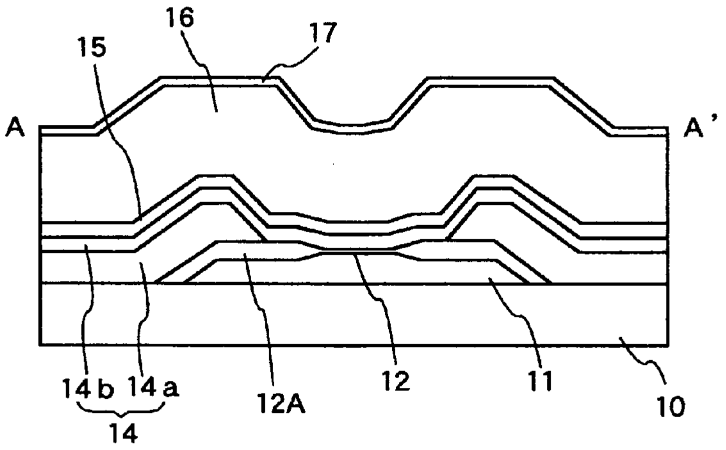
Figure 22C:
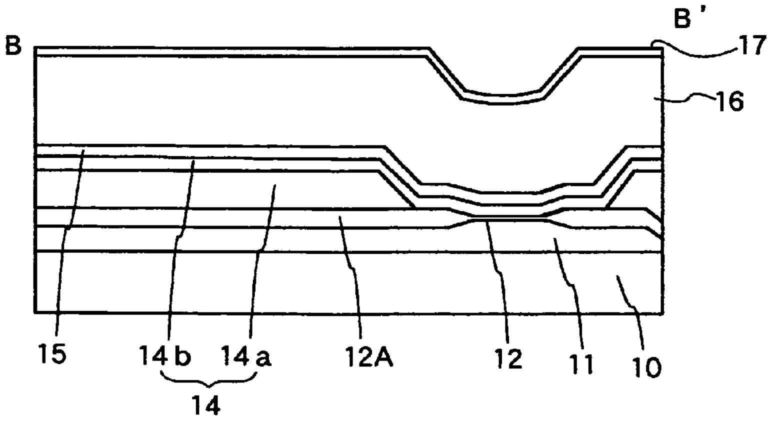

In FIG. 22, silicon nitride ($Si_3N_4$), silicon oxide ($SiO_2$) or mixture of these two (SiON) is formed as an upper layer 14*b* of the interlayer insulator. Chromium (Cr) is formed in thickness of 100 nm as a contact electrode 15. Al alloy as described above is formed in thickness of 2 μm as the top electrode bus line 16, and chromium (Cr) is formed on it in thickness of 50 nm as the cap electrode 17. Here, unlike the case of Embodiment 2, the positional relation between the lower layer and the upper layer of the interlayer insulator is such that the upper layer is formed to cover the opening of the lower layer.

Figure 23:
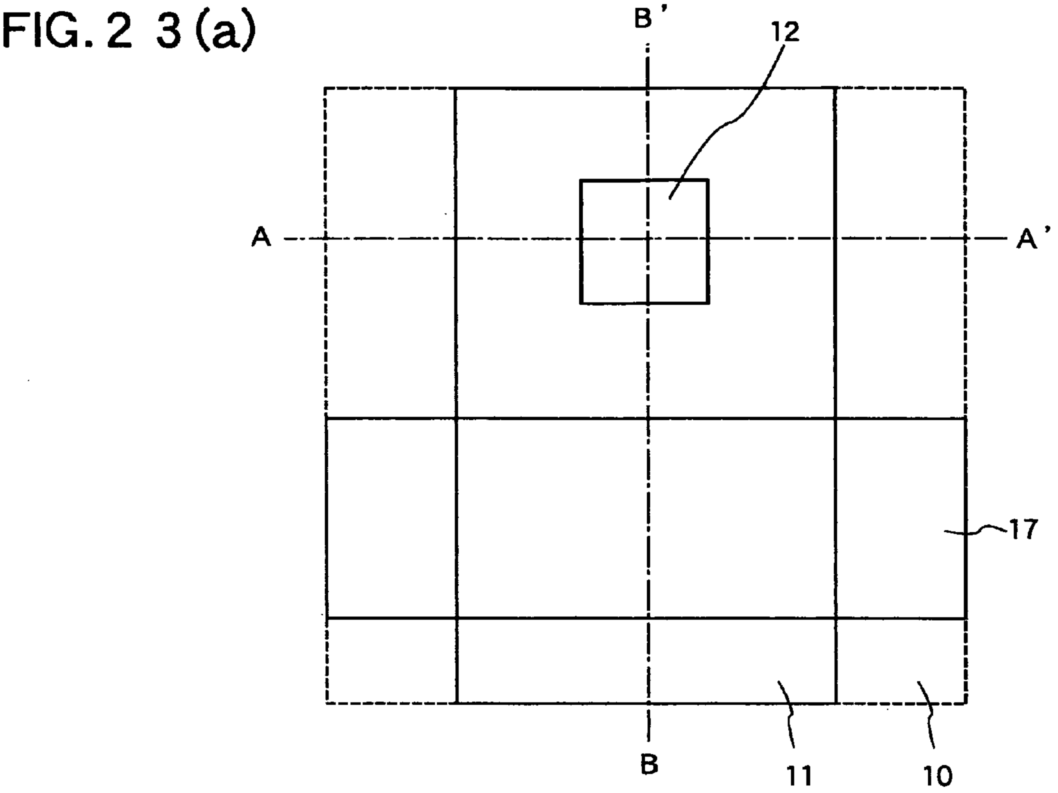
FIG. 23 represents drawings similar to those of FIG. 22 for manufacturing the thin-film electron source in Embodiment 3 of the present invention.
Figure 23:
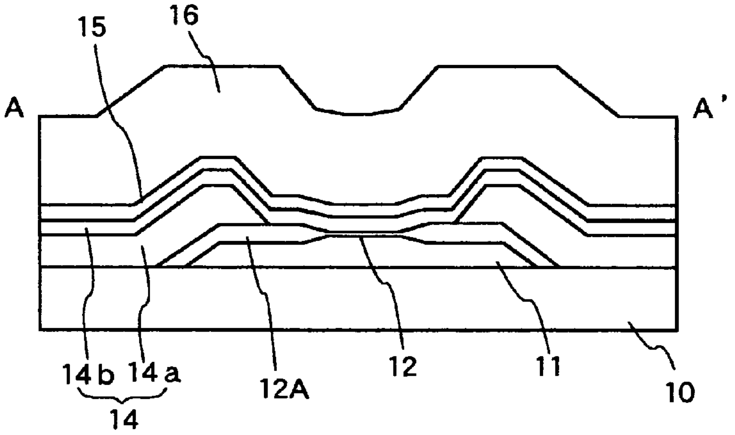
Figure 23:
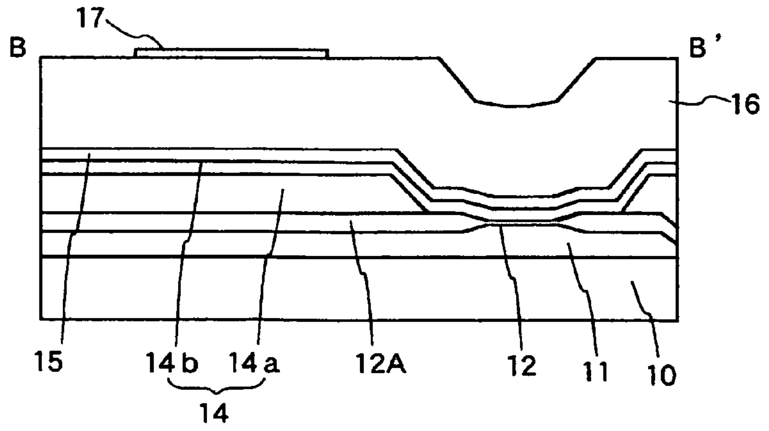

In FIG. 23, chromium of the cap electrode 17 is left on a portion serving as the scan line. For the etching of Cr, a mixed aqueous solution of cerium diammonium nitrate and nitric acid is suitable. In this case, it is necessary to design in such manner that line width of Cr is narrower than line width of the top electrode bus line 16 to be manufactured in the subsequent process. This is because the top electrode bus line 16 is made of aluminum alloy of 2 μm in thickness and the side etching of the same extent inevitably occurs due to the wet etching. If proper consideration is not given on this point, the cap electrode 17 may protrude in form of an eave from the top electrode bus line 16. The portion protruded in form of eave of the cap electrode 17 is poor in strength and is very likely to collapse during the manufacturing process or may be peeled off, causing short-circuit between bus lines or may induce serious arc discharge because electrostatic focusing occurs when high voltage is applied.

In FIG. 24, the top electrode bus line 16 is processed in stripe-like form in a direction perpendicularly crossing the bottom electrode 11. As the etching solution, a mixed aqueous solution of phosphoric acid, acetic acid, and nitric acid (PAN) is suitable, for instance.

Figure 25A:
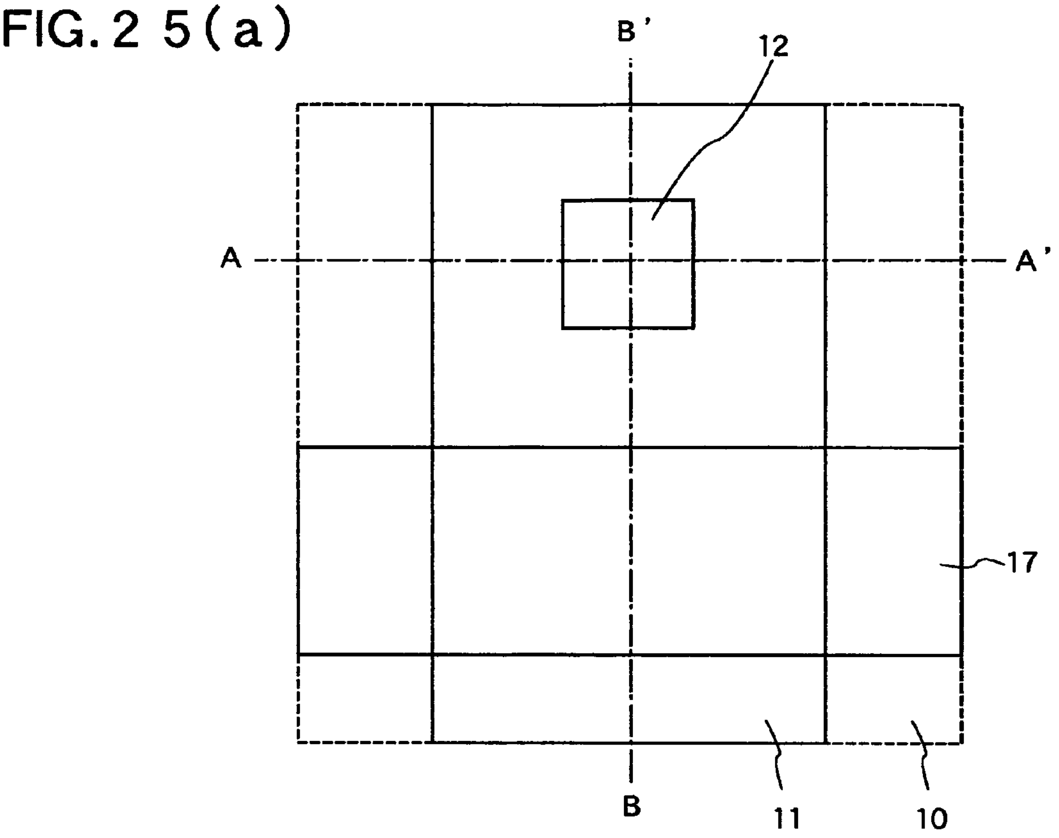
FIG. 25 represents drawings similar to those of FIG. 24 for manufacturing the thin-film electron source in Embodiment 3 of the present invention.
Figure 25B:
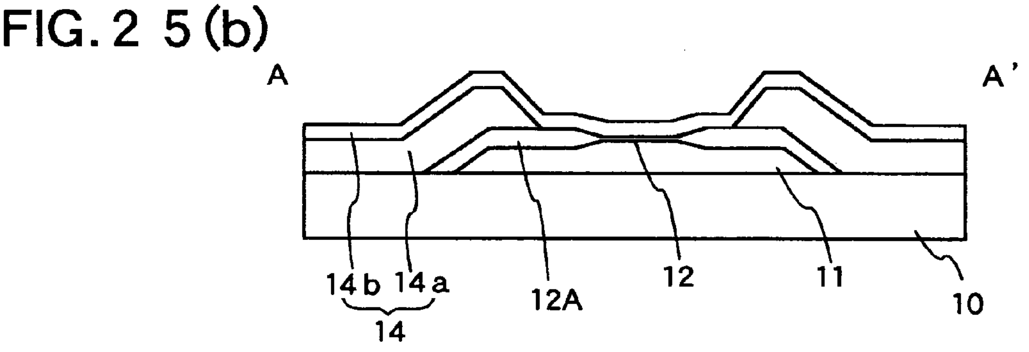
Figure 25C:
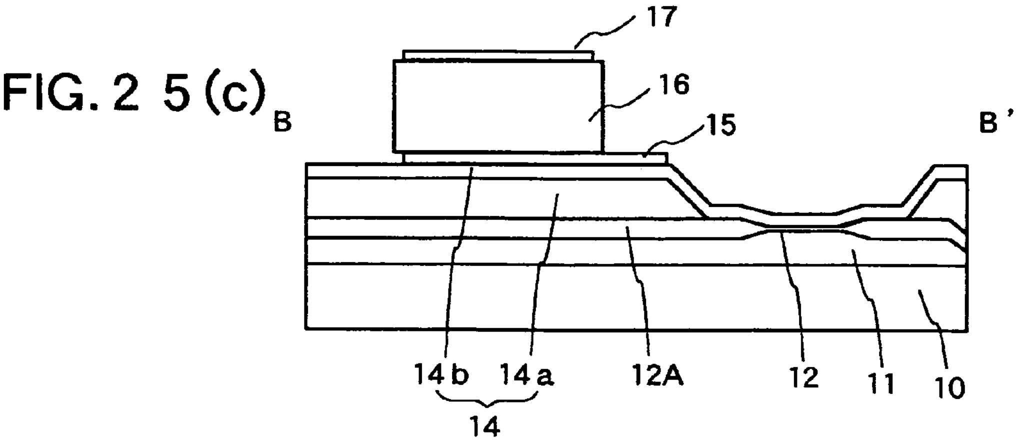

In FIG. 25, the contact electrode 15 is processed so that it is protruded toward the opening of the interlayer insulator 14 and that it is retracted with respect to the top electrode bus line 16 (to form an undercut) on the opposite side. For this purpose, the photoresist pattern should be placed on the contact electrode 15 in the former case. It should be placed on the cap electrode 17 in the latter case, and wet etching should be performed. As the etching solution, a mixed aqueous solution of cerium diammonium nitrate as described above is suitable. In this case, the lower layer 14*a* of the interlayer insulator plays a role of an etching stopper to protect the tunneling insulator 12 from the etching solution.

Figure 26A:
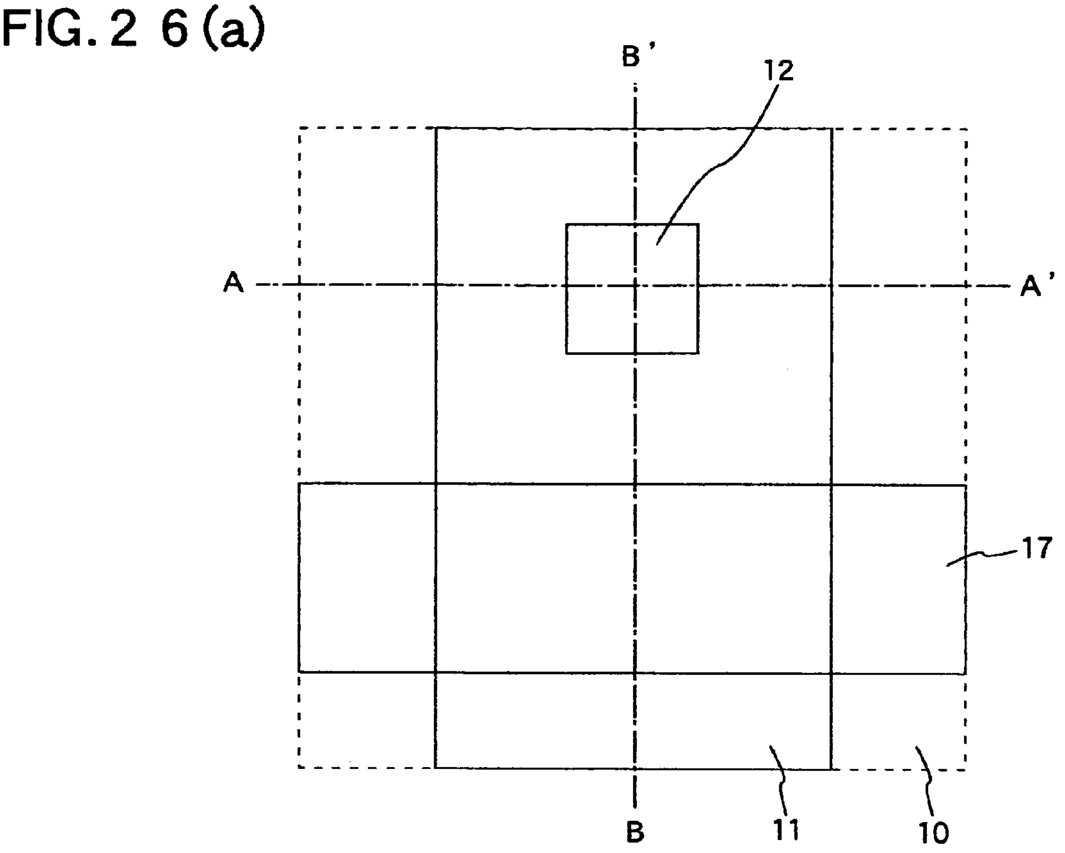
FIG. 26 represents drawings similar to those of FIG. 25 for manufacturing the thin-film electron source in Embodiment 3 of the present invention.
Figure 26B:
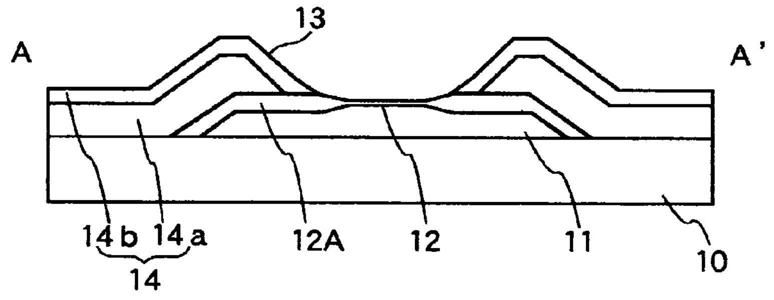
Figure 26C:
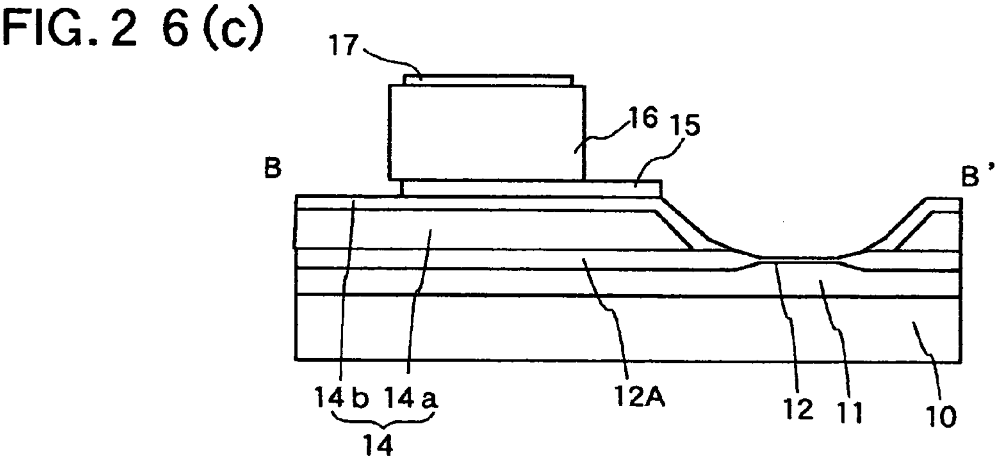
Figure 27A:
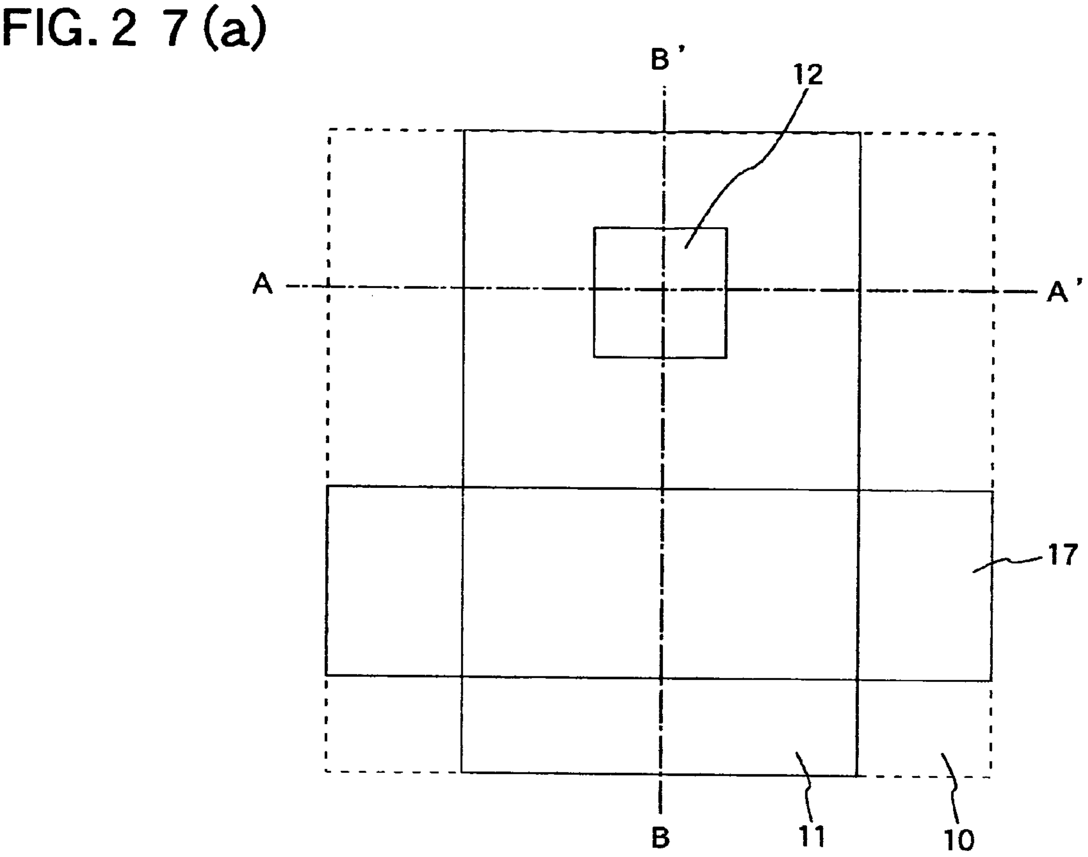
FIG. 27 represents drawings similar to those of FIG. 26 for manufacturing the thin-film electron source in Embodiment 3 of the present invention.
Figure 27B:
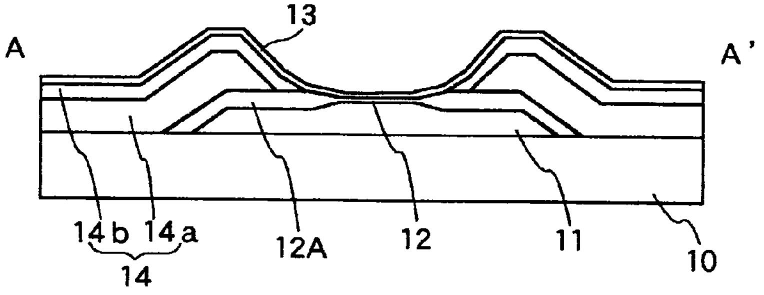
Figure 27C:
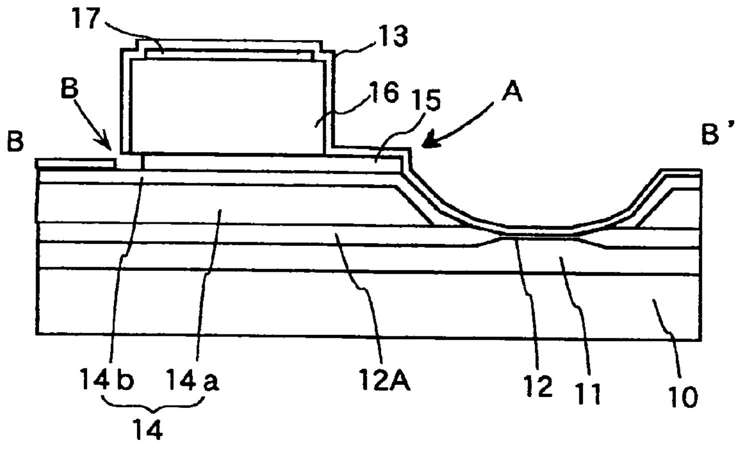

In FIG. 26, to provide an electron emission region, an opening is formed on a part of the interlayer insulator 14 by photolithography and dry etching. As the etching gas, mixed gas of $CF_4$ and $O_2$ is suitable. The exposed tunneling insulator 12 is again processed by anodic oxidation to repair the damage caused by the processing.

In FIG. 27, the top electrode 13 is formed, and the cathode substrate (electron source substrate) is completed. For film deposition on the top electrode 13, a shadow mask is used, and the sputtering method is performed so that film may not be deposited on terminal of electric wiring around the substrate. The top electrode bus line 16 may be poorly covered on the undercut structure (arrow B) as described above, and the top electrode 13 may be automatically separated for each scan line. In the present embodiment, it is assumed that re-flowing occurs due to heat treatment during the manufacturing process—in particular, due to heat treatment in the sealing process of the panel as described later on the interlayer insulator 14 formed by coating film deposition. The re-flowing is suppressed because the tapered portion of the interlayer insulator 14*a* is covered by the upper layer 14*b* of the interlayer insulator on the connection side (arrow A), and no influence is exerted on the conduction of the top electrode. As the material of the top electrode 13, a laminated film of Ir, Pt and Au is used, and the thickness of each film is set to several nm. As a result, it is possible to avoid contamination and damage to the top electrode 13 and to the tunneling insulator 12 due to the photolithography and etching.

Embodiment 4

Next, description will be given on an arrangement of Embodiment 4 of the image display device using MIM type cathode substrate referring to FIG. 28 and FIG. 29. First, according to the manufacturing procedure of Embodiments 1 to 3 as described above, a cathode substrate with a plurality of MIM type electron sources arranged on a cathode substrate 10 is prepared. To facilitate the explanation, a plan view and cross-sectional views of a (3×4)-dot MIM type electron source substrate are shown in FIG. 28. Actually, a matrix of as many MIM type electron sources as the number of display dots is formed.

FIG. 28(*a*) represents a plan view, and FIG. 28(*b*) is a cross-sectional view along the line A-A' in FIG. 28(*a*), and FIG. 28(*c*) is a cross-sectional view along the line B-B' of FIG. 28(*a*). The same functional component as in the above explanation is referred by the same symbol.

Description has not been given in the manufacturing procedure for MIM type electron source. However, when the image display device is made up, electrode surfaces must be exposed to ensure the connection of the ends of the bottom electrode 11 and the top electrode bus line 16 with the driving circuit.

Figure 29:
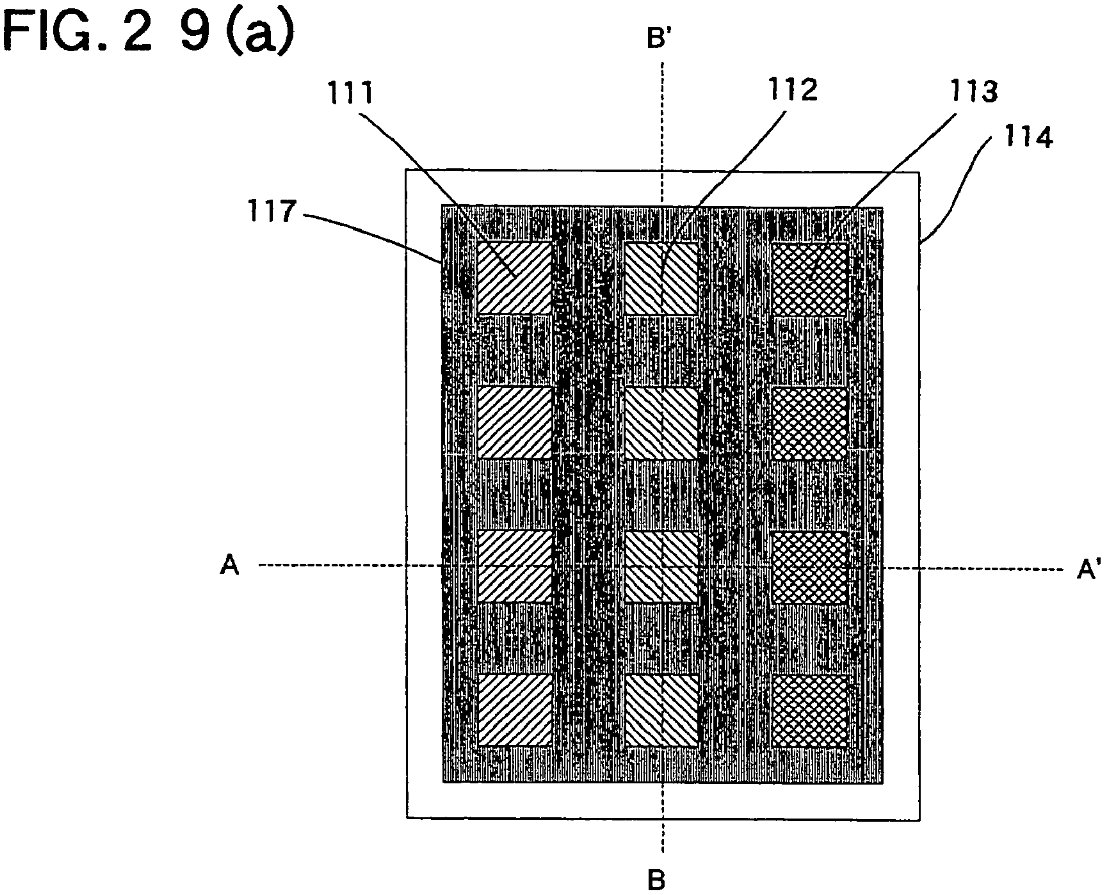
FIG. 29 represents drawings to explain another arrangement of Embodiment 4 of the image display device with an anode substrate.
Figure 29:
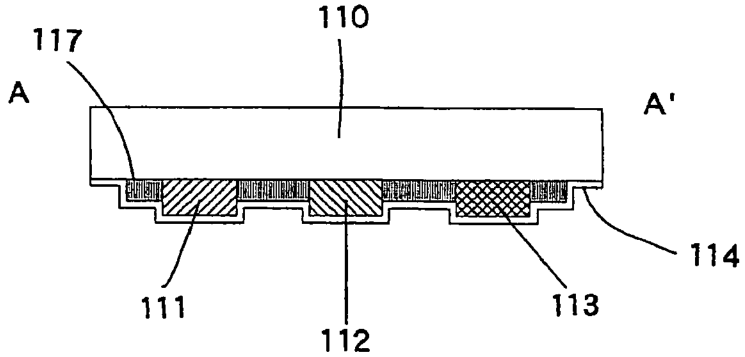
Figure 29:
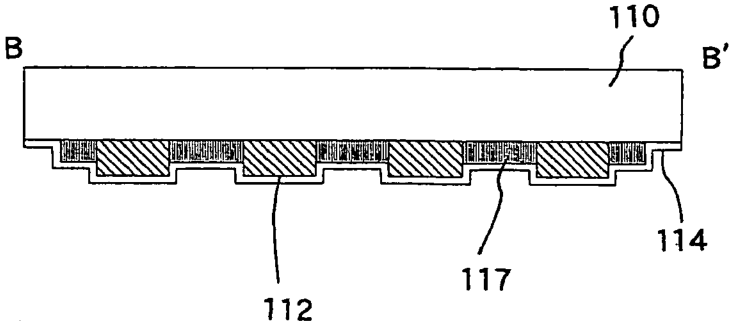
Figure 3:
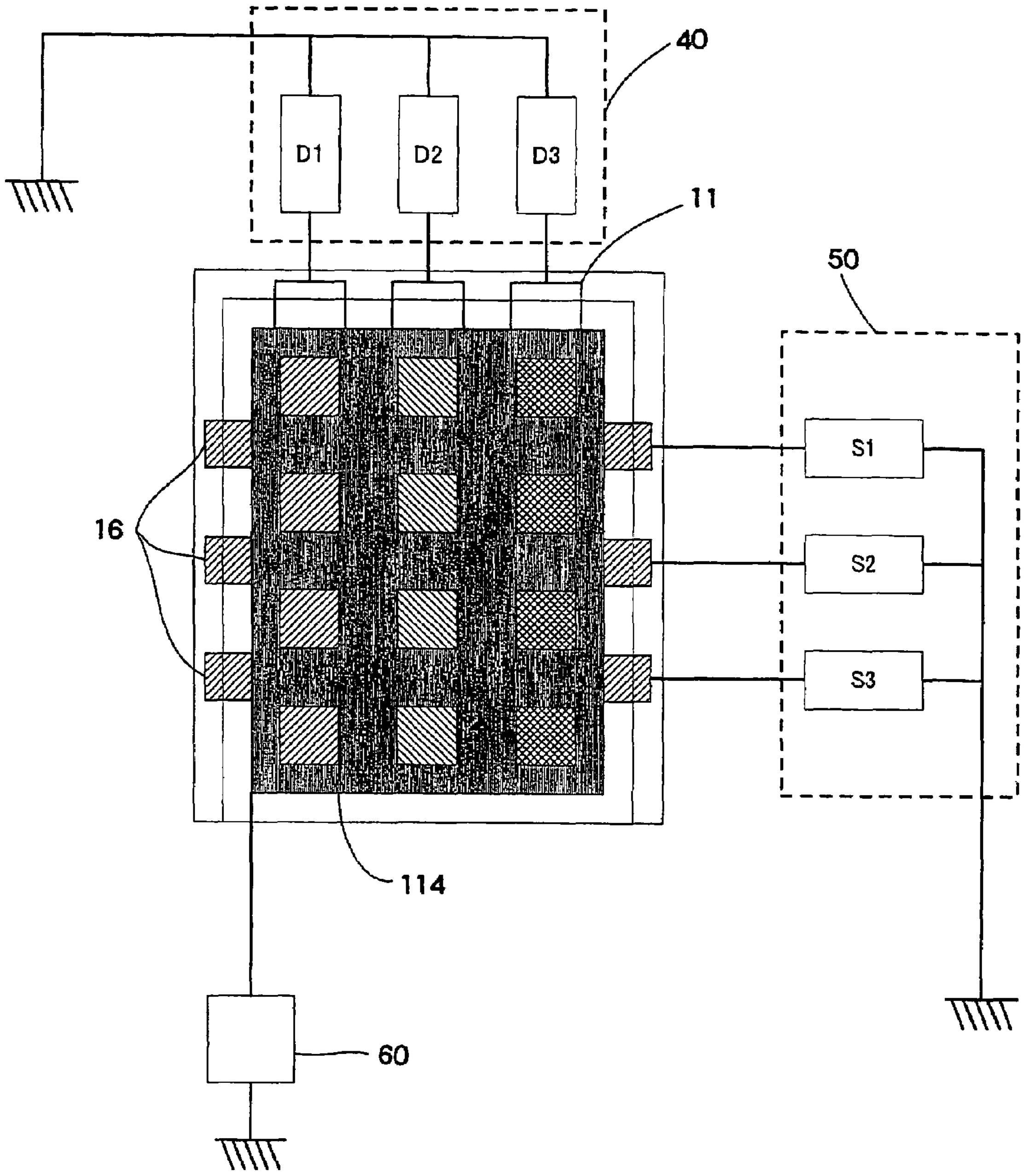
Figure 3:
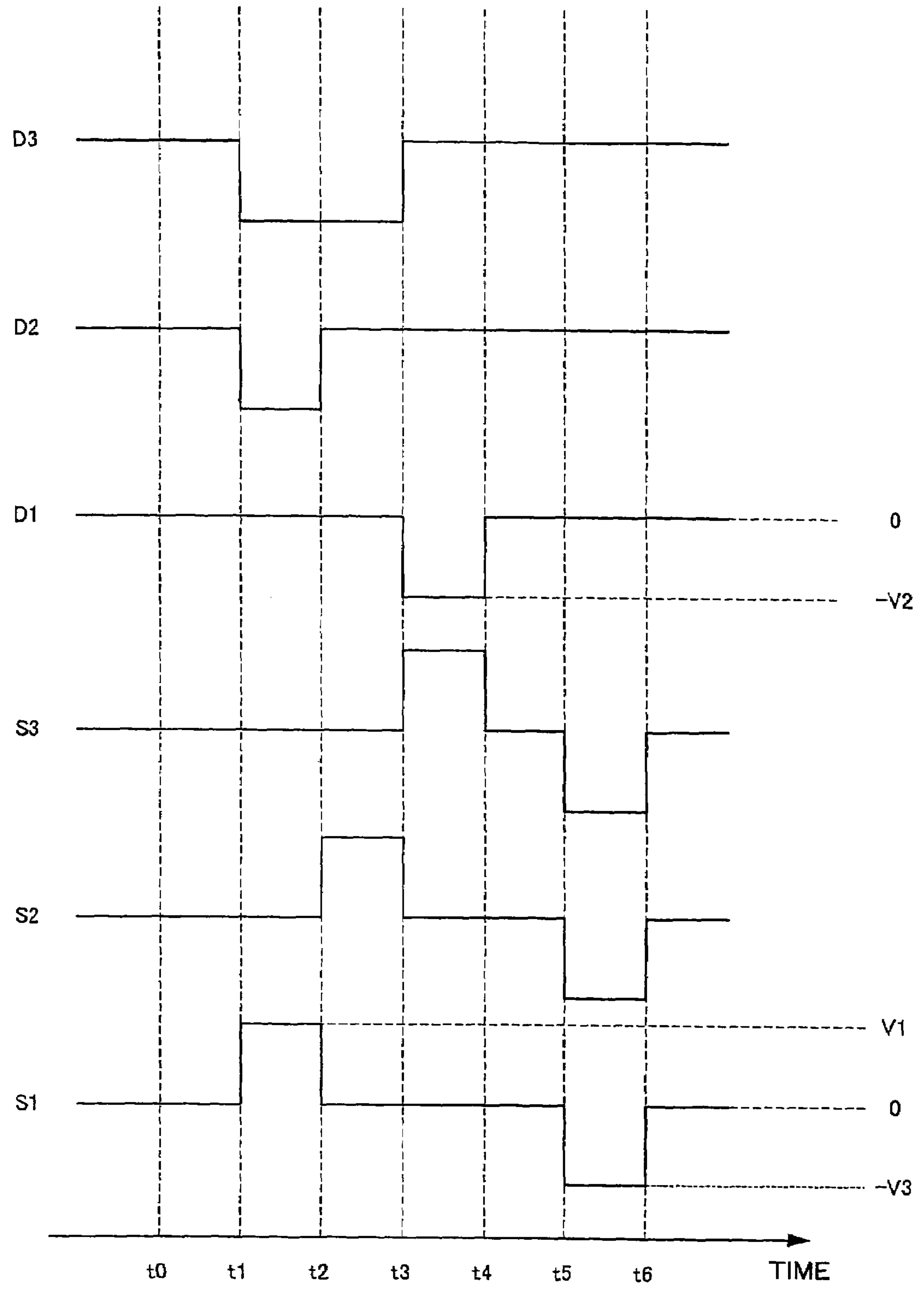

Referring to FIG. 29, description will be given on the arrangement of anode substrate according to its manufacturing procedure. As an anode substrate 110, a light-transmitting material such as glass is used. First, a black matrix 117 is formed for the purpose of promoting the contrast of the image display device. To form the black matrix 117, a solution containing PVA (polyvinyl alcohol) and ammonium dichromate is coated on the anode substrate 110. Then, ultraviolet ray is irradiated on it except the portion where the black matrix 117 is to be formed. Then, unexposed portion is removed, and a solution with graphite powder dissolved in it is coated, and PVA is lifted off.

Next, a red phosphor 111 is formed. An aqueous solution containing PVA (polyvinyl alcohol) and ammonium dichromate mixed with phosphor particles is coated on the anode substrate 110. Then, a portion where phosphor is to be formed is exposed to ultra-violet ray, and unexposed portion is removed under running water. Thus, the red phosphor 111 is turned to a pattern. In similar manner, a green phosphor 112 and a blue phosphor 113 are prepared. As the phosphor, $Y_2O_2S$:Eu should be used for red phosphor (P22-R), for instance. ZnS:Cu,Al should be used for green phosphor (P22-G), and ZnS:Ag for the blue phosphor (P22-B).

Next, the surface is flattened by filming using a film such as nitrocellulose. Then, aluminum is deposited by vacuum deposition in thickness of about 75 nm over the entire anode substrate 110, and a metal back 114 is prepared. The metal back 114 serves as an accelerator electrode. Next, the anode substrate 110 is heated to about 400° C. in the atmospheric air to decompose the filming and organic substances such as PVA by thermal decomposition. As a result, the anode substrate is completed. The anode substrate 110 thus prepared and the cathode substrate 10 are sealed by using frit glass 115 via spacers 30 and with a frame glass 116 positioned around the display region.

FIG. 30 represents cross-sectional views of an image display device with a cathode substrate and an anode substrate affixed together. FIG. 30(*a*) is a cross-sectional view along the line A-A' in FIG. 29, and FIG. 30 (*b*) is a cross-sectional view along the line B-B' in FIG. 29. The height of the spacer 30 is set to such a value that a distance between the anode substrate 110 and the cathode substrate 10 affixed together will be about 1 to 3 mm. As the spacer 30, planar glass or ceramics is placed on the top electrode bus line 16, for instance. In this case, the spacers are positioned under the black matrix 117 on the display substrate side, and the spacers 30 do not block light emission. Here, to facilitate the explanation, all spacers 30 are erected for each dot to emit light in R (red), G (green), and B (blue), i.e. on the top electrode bus line 16. Actually, however, the number of the spacers 30 may be decreased to such an extent as to be allowable by mechanical strength. For example, the spacers may be erected at every several centimeters.

Although description has not been given in the present embodiment, panel assembling can be accomplished by similar procedure even in case a pillar type spacer or a cross type spacer is used. The panel can be perfectly sealed by providing vacuum condition of about $10^{-7}$ Torr. After sealing, the incorporated getter is activated, and high vacuum condition is maintained within the container, which comprises the substrates and the frame. For example, in case of the getter material using Ba as main component, a getter film can be prepared by high frequency induction heating. Also, a non-evaporation type getter using Zr as main component may be used. As a result, a display panel using MIM type electron source is completed. Because the distance between the anode substrate 110 and the cathode substrate 10 is as long as about 1 to 3 mm, the voltage to be applied on the metal back 114 can be set to a voltage as high as 1 to 10 kV. Thus, a phosphor for cathode ray tube (CRT) can be used as the phosphor.

FIG. 31 is a connection diagram to the driving circuit of the image display device manufactured according to the above procedure. The bottom electrode 11 is connected to the data line driving circuit 40 via a flexible printed circuit (FPC). The data line driving circuit 40 has driving circuits D1, D2 and D3 to match each of the data lines (bottom electrodes 11). The top electrode bus line 16 is connected to the scan line driving circuit 50 via FPC. The scan line driving circuit 50 has driving circuits S1, S2 and S3 to match each of the scan lines (top electrodes 13) respectively.

The advantageous features of this system is that ground potential to the spacers can be given at the same time as the connection of the scan lines without increasing the number of the manufacturing processes. A pixel positioned at an intersection of m-th top electrode bus line 16 and n-th bottom electrode 11 is given by coordinates (m, n). On the metal back 114, accelerator voltage of about 1 to 10 kV is applied from a high voltage generating circuit 60. In the present embodiment, it is assumed that both the scan lines and the data lines are driven from one side, while the present invention can be achieved by providing the driving circuits on both sides.

FIG. 32 shows examples of waveforms of the voltage generated in each of the driving circuits. At a time t0, the voltage is zero on any of the electrodes. Electrons are not emitted, and phosphors emit no light. At a time t1, a voltage of V1 is applied only on S1 among the top electrode bus lines 16, and a voltage of −V2 is applied on D2 and D3 among the bottom electrodes 11. At the coordinates (1,2) and (1,3), a voltage of (V1+V2) is applied between the bottom electrode 11 and the top electrode bus line 16. Thus, if the voltage of (V1+V2) is set to a value over the electron emission starting voltage, electrons are emitted into vacuum space from these MIM type electron sources. The electrons thus emitted are accelerated by acceleration voltage applied on the metal back 114 from the high voltage generating circuit 60. Then, the electrons enter the phosphor and emit light.

Similarly, at a time t2, when a voltage of V1 is applied on S2 of the top electrode bus lines 16 and a voltage of V2 is applied on D3 of the bottom electrode 11, light is turned on at the coordinates (2,3) in similar manner. By changing the signal to be applied on the top electrode bus line 16, an image of an information as desired can be displayed. Also, by adequately changing the value of voltage (−V2) to be applied to the bottom electrode 11, an image with gray scale can be displayed. At a time t5, reverse bias for releasing electric charge accumulated in the tunneling insulator 12 is applied. Specifically, a voltage of −V3 is applied to all of the top electrode bus lines 16 and a voltage of 0 V is applied on all of the bottom electrodes 11 at the same time.

Embodiment 5

Figure 33A:
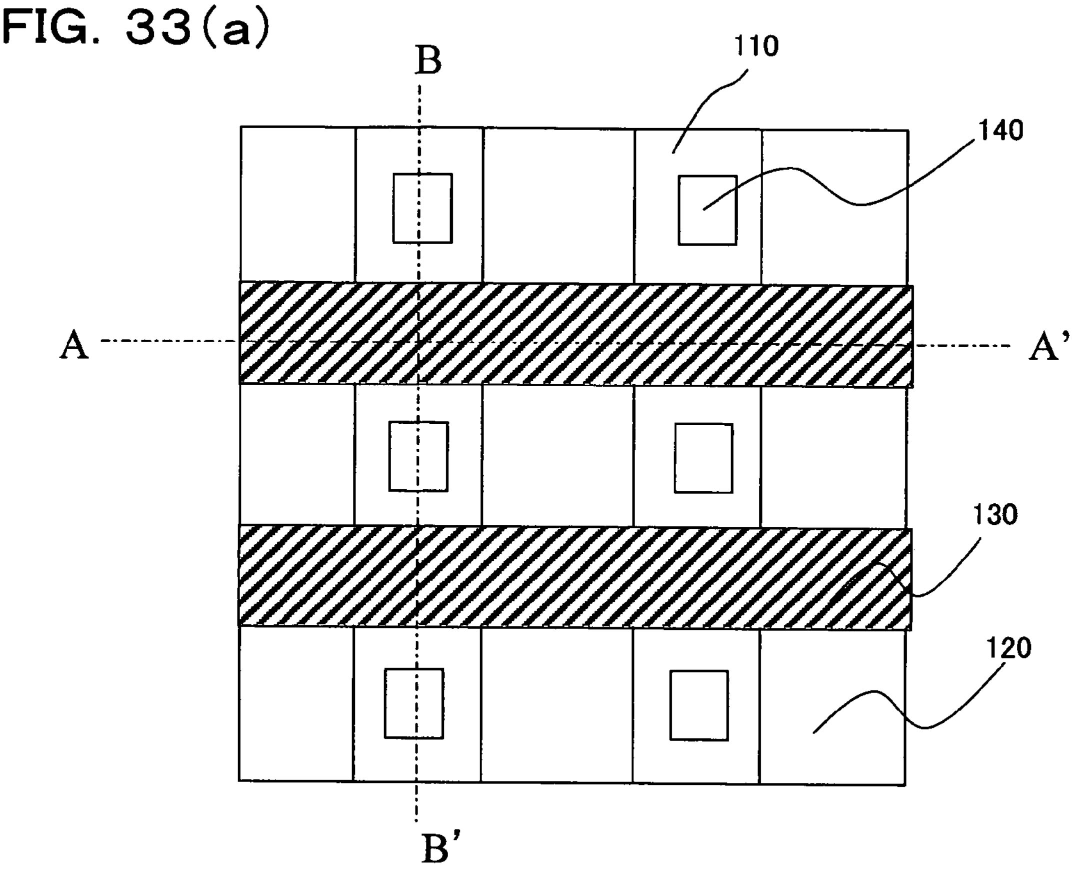
FIG. 33 represents drawings to explain an essential structure of Embodiment 5 of the present invention.
Figure 33B:
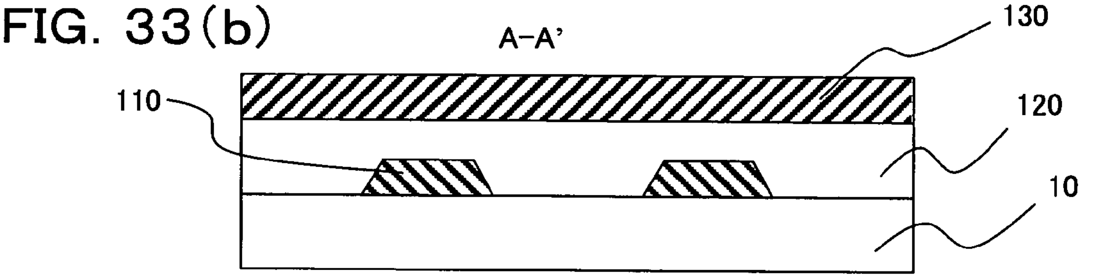
Figure 33C:
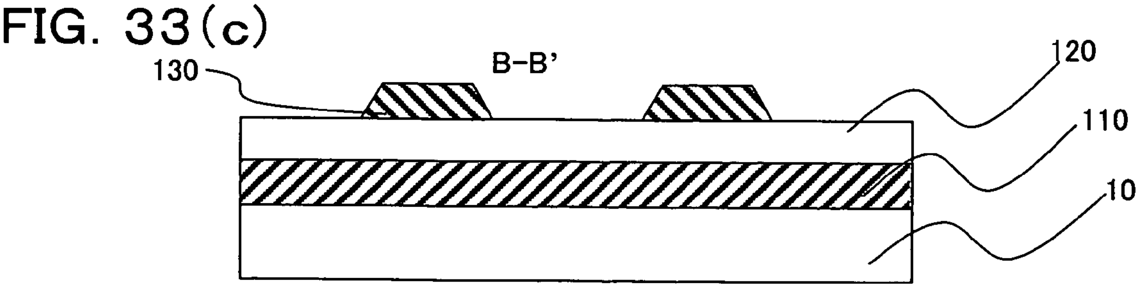

FIG. 33 represents drawings to explain a structure of an essential portion of Embodiment 5 of the present invention. FIG. 33(*a*) is a plan view. FIG. 33(*b*) is a cross-sectional view along the line A-A' of FIG. 33(*a*), and FIG. 33(*c*) is a cross-sectional view along the line B-B' of FIG. 33(*a*). On the cathode substrate 10, a metal film 110 serving as the bottom electrode, an interlayer insulator 120 coated to cover the metal film 110 (here, the field insulator and the tunneling insulator are also included)), and a metal film 130 to make up the top electrode are formed. Here, only two each of the metal films 110 and the metal films 130 are shown. Near each of the intersections of the metal film 110 and the metal film 130, electron sources 140 are arranged respectively. The metal film 110 and the metal film 130 are electrically connected to one electrode (bottom electrode) and to the other electrode (top electrode) of the electron source 140, but detailed structure is not shown. There is no special requirement on the material of the metal film 110.

The interlayer insulator 120 is an insulating film prepared by printing method such as screen printing or by spin coating, drying and sintering. For instance, inorganic polysilazane, organic polysilazane or a mixture of inorganic polysilazane and organic polysilazane may be used. The metal film 130 is deposited on the interlayer insulator 120 by the means such as sputtering method.

FIG. 34 is a table to explain intrinsic stress of principal wiring material prepared by the sputtering method. As shown in FIG. 34, metals such as aluminum (Al) or copper (Cu) with low melting point have lower intrinsic stress, while metals with high melting point such as molybdenum (Mo) or chromium (Cr) have higher tensile stress. In this respect, if aluminum or copper is used as a metal film 130 to be formed on the interlayer insulator 120, i.e. the coating type insulating film of FIG. 33, no crack occurs on the interlayer insulator 120. Incidentally, in case aluminum is formed in thickness of 3 μm on the interlayer insulator 120, which serves as the coating type insulating film, or incase copper is formed in thickness of 3 μm in similar manner, cracks do not occur on the interlayer insulator 120 serving as the coating type insulating film. However, when chromium or molybdenum is formed in thickness of 100 nm respectively, cracks occur on the coating type insulating film 120.

In the arrangement given in Embodiment 5, cracks on metal bus lines such as scan lines on the interlayer insulator can be avoided even when the coating type insulating film is used as the interlayer insulator. As a result, peeling of film can be prevented and disconnection can be avoided. Also, by using the coating type insulating film with higher thickness as the interlayer insulator, the bus lines can be designed with lower capacity. This contributes to the reduction of power consumption and driver load, and an image display device can be obtained, which has high reliability and which can prevent signal delay.

Embodiment 6

Figure 35A:
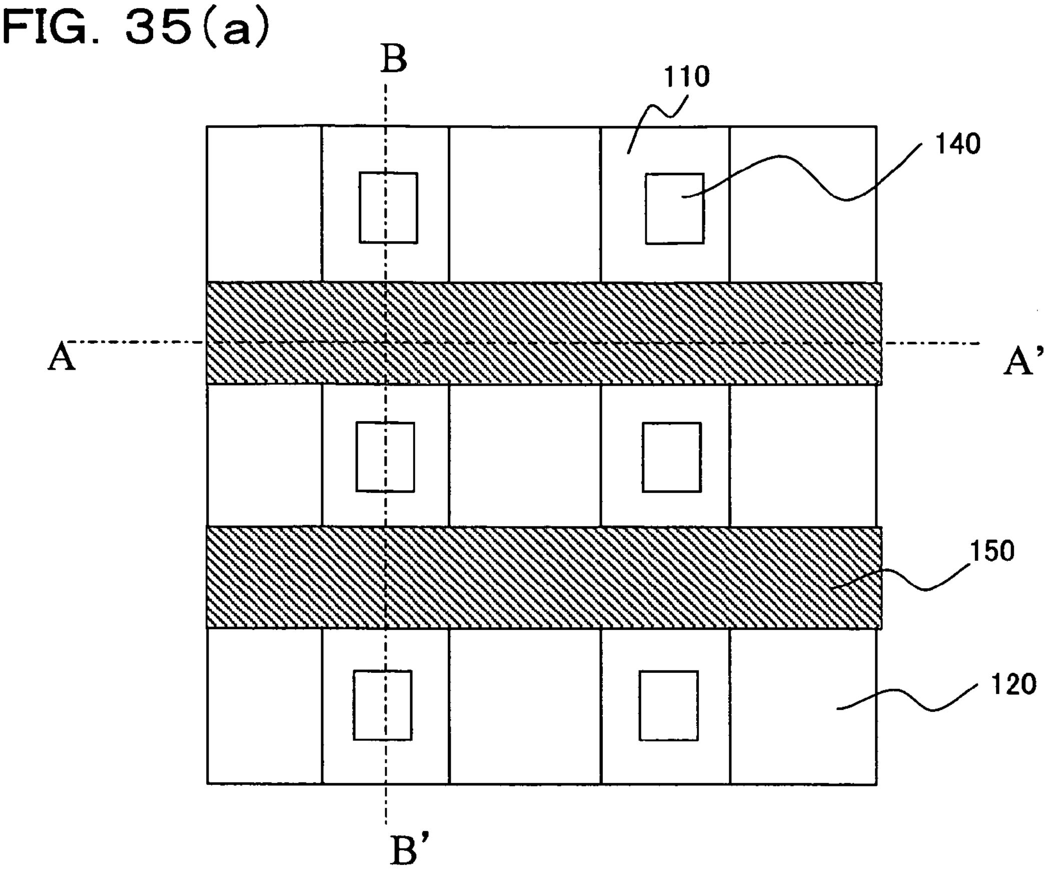
FIG. 35 represents drawings to explain a structure of an essential portion of Embodiment 6 of the present invention.
Figure 35B:
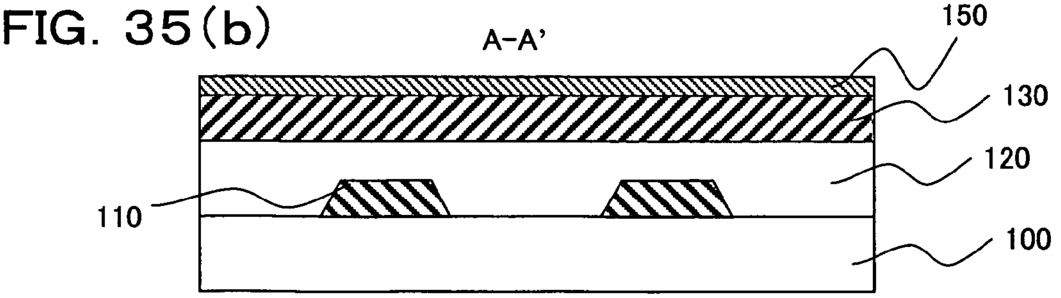
Figure 35C:
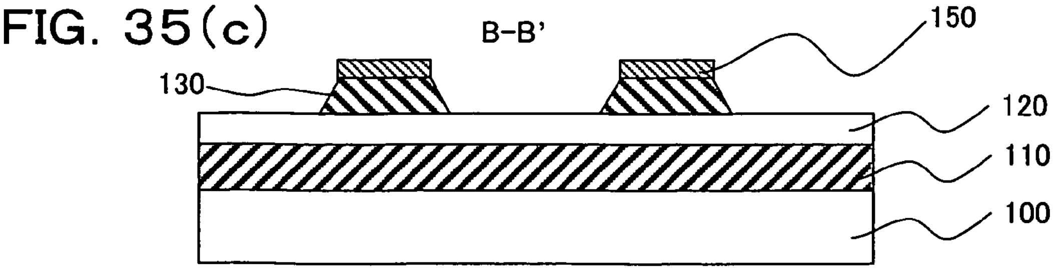

FIG. 35 represents drawings to explain the structure of an essential portion of Embodiment 6 of the present invention. FIG. 35(*a*) is a plan view. FIG. 35(*b*) is a cross-sectional view along the line A-A' of FIG. 35(*a*), and FIG. 35(*c*) is a cross-sectional view along the line B-B' of FIG. 35(*a*). The same functional component as in FIG. 33 is referred by the same symbol. In addition to the arrangement shown in FIG. 33, a high melting point metal 150 having high tensile stress is laminated on the metal film 130 serving as scan lines of aluminum or copper as shown in FIG. 35 because aluminum and copper in contact with the interlayer insulator 120, serving as coating type insulating film, fulfils the function as a stress-alleviating layer. As the high melting point metal 150, chromium (Cr), molybdenum (Mo), nickel (Ni), tungsten (W) or alloy of two types of more of these metals may be used, which would have a minus (tensile) value of intrinsic stress in a range of 500 MPa to 2 GPa.

Because copper (Cu) is easily oxidized, it is more effective to laminated chromium layer, which also fulfils the function as an anti-oxidation layer. Aluminum is processed by tapering using the wet etching process during the patterning. In this case, if molybdenum or molybdenum alloy with higher etching rate than aluminum is laminated, tapering can be made much easier.

On the other hand, even when chromium film is used, which has high tensile stress in a range of 500 MPa to 2 GPa, if film thickness is reduced to a level of 10 nm or lower, tensile strength can be decreased. Thus, cracking can be prevented even when the film is directly deposited on the interlayer insulator, which serves as a coating type insulating film.

According to Embodiment 6, it is possible to prevent cracking of metal bus lines formed on the interlayer insulator due to drying and shrinking caused by firing of the interlayer insulator, and it is also possible to prevent peeling of films and to avoid disconnection of metal bus lines even when the coating type insulating film is used as the interlayer insulator. Also, by using the coating type insulating film with higher thickness as the interlayer insulator, it is possible to reduce the capacity of the bus lines, and this contributes to the reduction of power consumption and driver load, and an image display device can be obtained, which can prevent signal delay and which has high reliability.

Embodiment 7

Figure 36A:
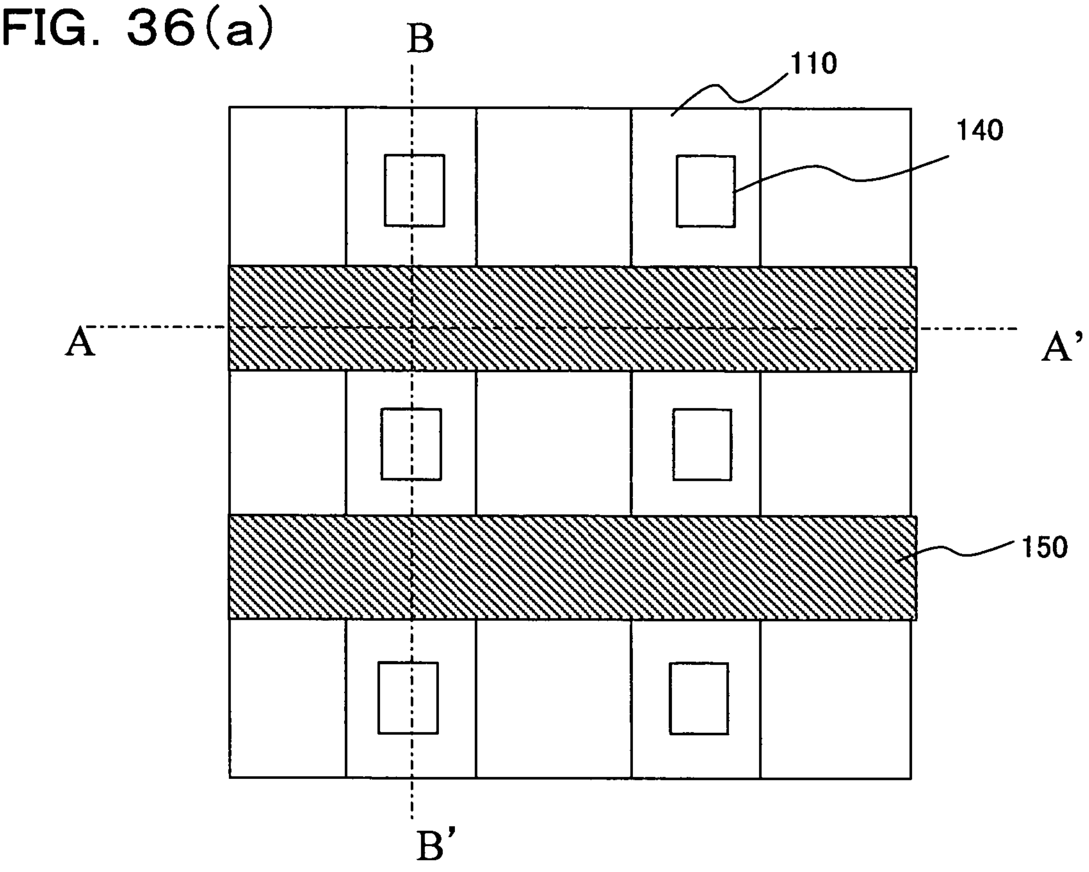
FIG. 36 represents drawings to explain a structure of an essential portion of Embodiment 7 of the present invention.
Figure 36B:
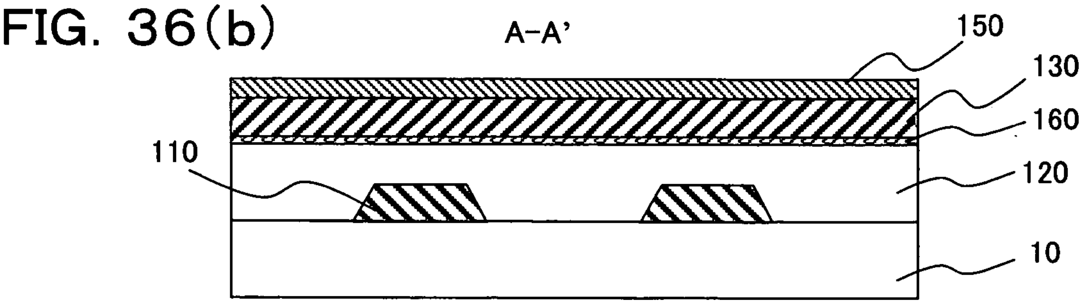
Figure 36C:
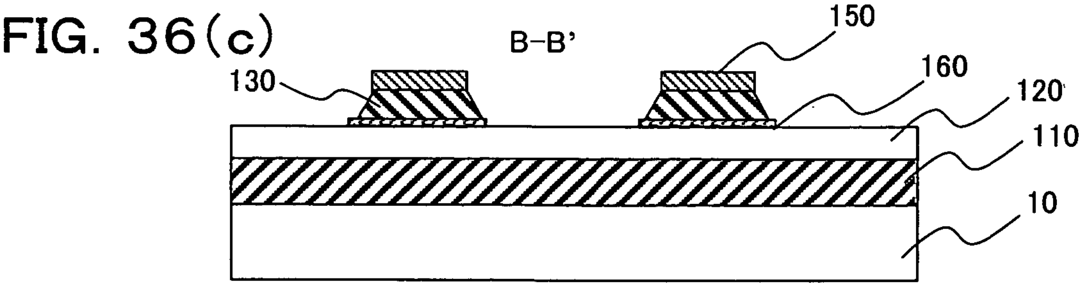

FIG. 36 represents drawings to explain the structure of an essential portion of Embodiment 7 of the present invention. FIG. 36(*a*) is a plan view. FIG. 36(*b*) is a cross-sectional view along the line A-A' in FIG. 36(*a*), and FIG. 36(*c*) is a cross-sectional view long the line B-B' in FIG. 36(*a*). The same functional component as in FIG. 33 and FIG. 35 is referred by the same symbol. As shown in FIG. 36, a metal layer 160 made of chromium or chromium alloy in thickness of 10 nm or lower is formed under the layer of aluminum or copper in Embodiment 7. This metal layer 160 is effective as an adhesive layer to attain adhesion with the interlayer insulator. The other arrangement and operational features are the same as those of the embodiment shown in FIG. 35.

According to Embodiment 7, it is possible to prevent cracking of metal bus lines formed on the interlayer insulator due to drying and shrinking caused by firing of the interlayer insulator, and it is also possible to prevent peeling of films and to avoid disconnection of metal bus lines even when the coating type insulating film is used as the interlayer insulator. Also, by using the coating type insulating film with higher thickness as the interlayer insulator, it is possible to reduce the capacity of the bus lines, and this contributes to the reduction of power consumption and driver load, and an image display device can be obtained, which can prevent signal delay and which has high reliability.

Embodiment 8

Figure 37A:
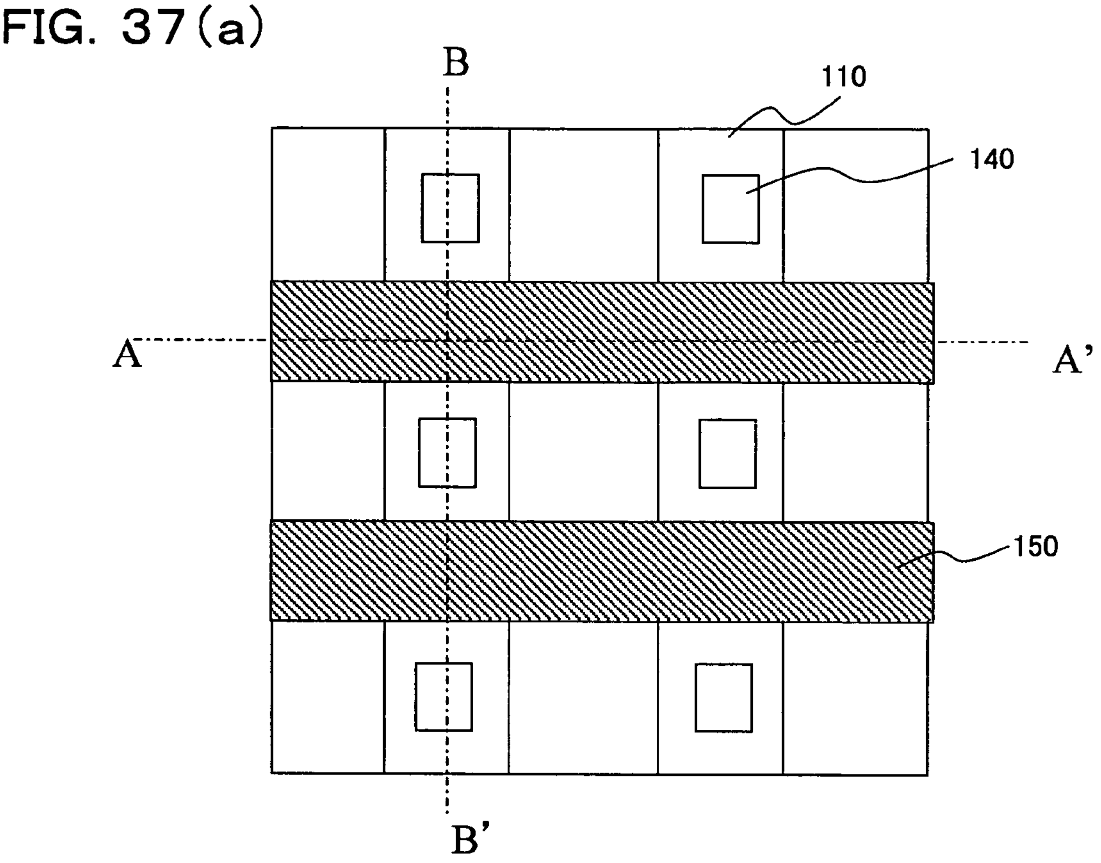
FIG. 37 represents drawings to explain a structure of an essential portion of Embodiment 8 of the present invention.
Figure 37B:
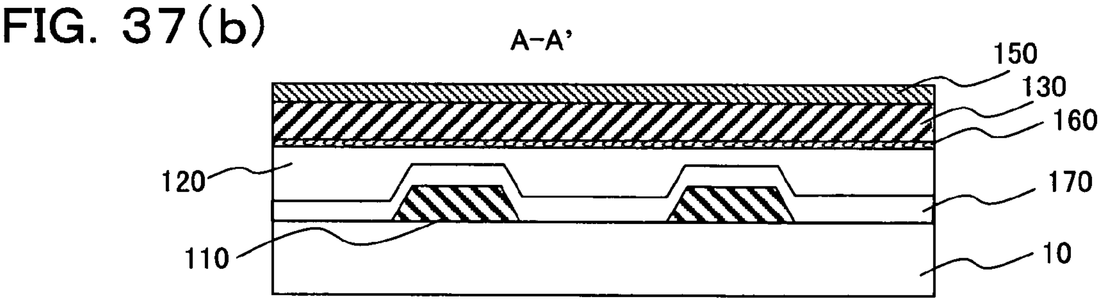
Figure 37C:
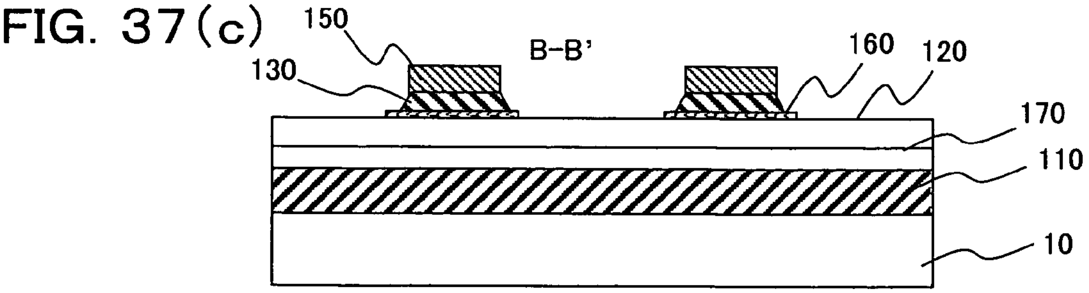

FIG. 37 represents drawings to explain the structure of an essential portion of Embodiment 8 of the present invention. FIG. 37(*a*) is a plan view. FIG. 37(*b*) is a cross-sectional view along the line A-A' in FIG. 37(*a*), and FIG. 37(*c*) is a cross-sectional view along the line B-B' in FIG. 37(*a*). The same functional component as in FIG. 33, FIG. 35, and FIG. 36 is referred by the same symbol. As shown in FIG. 37, a high melting point metal 160 such as chromium or chromium alloy with thickness of 10 nm or lower is formed on the interlayer insulator 120 in Embodiment 8 in similar manner as shown in FIG. 36, and a film of aluminum or copper is deposited on it. Then, a high melting point metal such as chromium or chromium alloy as described above is laminated on it.

In Embodiment 8, the coating type insulating film 120 as described above is formed on the insulating film 170 prepared by other processing. This insulating film 170 is combined with the insulating film prepared by dry process under vacuum condition or by wet process in solution, or it is combined with a laminated film of these types of film.

According to Embodiment 8, it is possible to prevent cracking of metal bus lines formed on the interlayer insulator due to drying and shrinking caused by firing of the interlayer insulator, and it is also possible to prevent peeling of films and to avoid disconnection of metal bus lines even when the coating type insulating film is used as the interlayer insulator. Also, by using the coating type insulating film with higher thickness as the interlayer insulator, it is possible to reduce the capacity of the bus lines, and this contributes to the reduction of power consumption and driver load, and an image display device can be obtained, which can prevent signal delay and which has high reliability. Further, it is possible to prepare the laminated insulated film, which has been prepared by forming the interlayer insulator by different film depositing process. As a result, it is possible to decrease the probability of poor insulation between the data lines and the scan lines and to improve the production yield.

Figure 38:
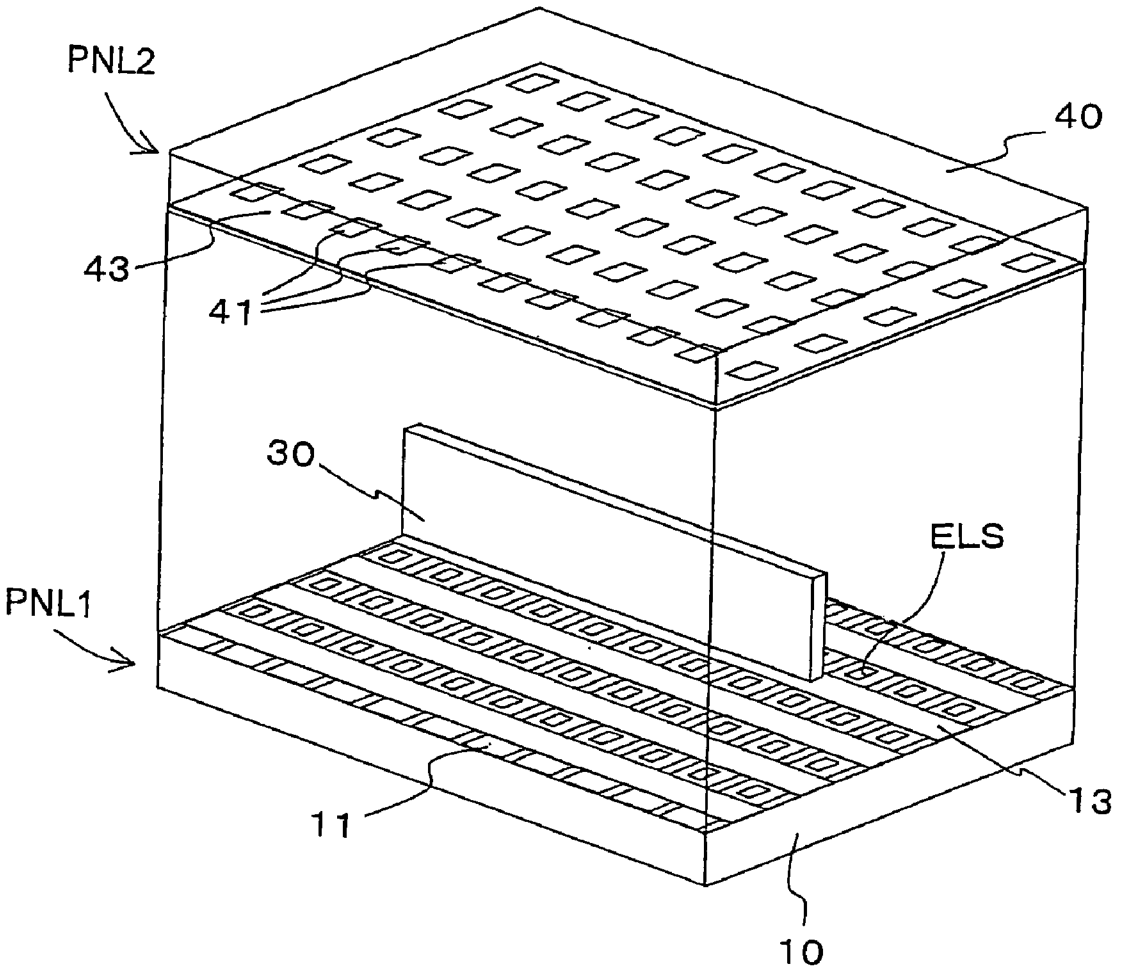
FIG. 38 is an explosive perspective view to explain general features of an overall arrangement of the image display device of the present invention.

FIG. 38 is an explosive perspective view to explain general features of an overall arrangement of the image display device of the present invention is an explosive perspective view to explain general features of an overall arrangement of the image display device according to the present invention. A backside panel PNL1 to make up the cathode substrate comprises a top electrode 13 extended in one direction on inner surface of the cathode 10 and aligned in other direction perpendicularly crossing said one direction and having a plurality of scan lines where scanning signals are sequentially applied in said other direction, a plurality of data lines 11 (bottom electrodes 11) aligned in said one direction as if the data lines extended in said other direction and crossing the top electrode 13 having scan lines, and electron sources ELS provided near each intersection of the top electrode 13 and the bottom electrode 11. The bottom electrode 11 is provided on the cathode substrate 10, and the top electrode 13 is formed on it via the interlayer insulator.

A front side panel PNL2 to make up the anode substrate comprises three sub-pixels 41 representing three colors (red (R), green (G) and blue (B)) respectively divided from each other by a black matrix 43 on inner surface of the substrate 40. In this arrangement, the spacers 30 are placed along the scan lines 13 on the top electrode 13 comprising the scan lines of the cathode substrate 10. The panels are affixed together via a frame glass (not shown) with predetermined spacing and these are sealed under vacuum condition. Only one of the spacers 30 is shown in the figure, while the spacers are normally distributed for the top electrodes 13 by dividing to a plurality of spacers—each to match each of the top electrodes 13 to make up one scan line.

In the embodiments as described above, description has been given on the image display device, in which data lines are formed on the substrate and scan lines are formed on it via an interlayer insulator, while it is needless to say that the present invention can also be applied to the case where the data lines and the scan lines are formed in the layers reverse to each other or the invention can also be applied to the wiring and electrodes other than the data lines and the scan lines.

What is claimed is:

1. An image display device provided with a vacuum panel container, comprising a cathode substrate where a plurality of thin-film type electron sources are arranged with predetermined spacing, an anode substrate where spot-like or linear phosphor films are arranged to face to each other, a plurality of spacers for supporting said cathode substrate and said anode substrate with predetermined spacing, and a frame glass for maintaining vacuum condition, wherein there are provided a plurality of electric bus lines extending in row direction and in column direction crossing perpendicularly via an interlayer insulator, and said thin-film type electron sources are connected with said electric bus lines in column direction and in row direction at positions corresponding to each of intersection coordinates, and an image is displayed by line-sequentially driving said thin-film type electron sources, wherein:

said electron source is a cold cathode type electron source which comprises a bottom electrode, a top electrode, and an electron accelerator interposed between said two electrodes; and said interlayer insulator is disposed between said bottom electrode and said bus line and comprises at least two layers of thin-film lamination including one layer of a thin-film insulating material formed by film coating and having a specific dielectric constant of not more than 5 and another layer of a thin-film insulating material deposited under vacuum condition.

2. An image display device provided with a vacuum panel container, comprising a cathode substrate where a plurality of thin-film type electron sources are arranged with predetermined spacing, an anode substrate where spot-like or linear phosphor films are arranged to face to each other, a plurality of spacers for supporting said cathode substrate and said anode substrate with predetermined spacing, and a frame glass for maintaining vacuum condition, wherein there are provided a plurality of electric bus lines extending in row direction and in column direction crossing perpendicularly via an interlayer insulator, and said thin-film type electron sources are connected with said electric bus lines in column direction and in row direction at positions corresponding to each of intersection coordinates; and an image is displayed by line-sequentially driving said thin-film type electron source, wherein:

said interlayer insulator is disposed between a bottom electrode of said electron source comprises at least two layers of thin-film lamination including one layer of a thin-film insulating material formed by film coating and having a specific dielectric constant of not more than 5 and another layer of a thin-film insulating material deposited under vacuum condition, and the electric wiring connected to the top electrode or the another layer of the interlayer insulator deposited under vacuum condition which is arranged in such manner as to cover at least a part of end portion of the pattern of the insulating material where the coating film can be deposited.

3. An image display device according to claim 1, wherein said bottom electrode is made of aluminum or aluminum alloy, and said electron accelerator is an anodic oxidized film thereof.

4. An image display device according to claim 2, wherein said bottom electrode is made of aluminum or aluminum alloy, and an electron accelerator of said electron source is an anodic oxidized film thereof.

5. An image display device according to claim 1, wherein the one layer of said insulating material deposited by film coating is made of inorganic polysilazane or organic polysilazane or a mixture of these two.

6. An image display device according to claim 2, wherein the one layer of said insulating material deposited by film coating is made of inorganic polysilazane or organic polysilazane or a mixture of these two.

7. An image display device according to claim 3, wherein the one layer of said insulating material deposited by film coating is made of inorganic polysilazane or organic polysilazane or a mixture of these two.

8. An image display device, comprising a cathode substrate and an anode substrate, said cathode substrate comprises thin-film type electron sources for emitting electrons and arranged in form of matrix and being electrically connected to scan lines and data lines near each of intersections of a plurality of scan lines serving as bus lines, and data lines intersecting said scan lines, said data lines serving as bottom electrodes of said electron sources and said anode substrate comprises an anode and phosphor films with a plurality of colors and arranged to match each of said thin-film electron sources, wherein:

an insulating film for providing insulation between said scan lines and said data lines is a coating type insulating film; and said scan lines or said data lines formed in contact with said coating type insulating film are made of metal films with tensile stress of 250 MPa or lower.

9. An image display device according to claim 8, wherein said metal film for forming said scan line or said data line is made of pure aluminum or pure copper, not containing added metal.

10. An image display device according to claim 8 wherein a high melting point metal film with melting point of 1200° C. or more is laminated on the metal film of said scan line or said data line formed on said coating type insulating film.

11. An image display device according to claim 10, wherein said high melting point metal film is made of at least one type of chromium, nickel, molybdenum and tungsten or made of an alloy comprising two types or more of these metals.

12. An image display device according to claim 8, wherein said metal film of said scan line or said data line formed on said coating type insulating film is a two-layer film comprising a high melting point transition metal with film thickness of not more than 100 nm, or more preferably, not more than 50 nm and a metal film made of aluminum or copper.

13. An image display device according to claim 8, wherein said metal film of said scan line or said data line formed on said coating type insulating film is a laminated film prepared by sequentially depositing a high melting point transition metal film with film thickness of not more than 10 nm, a metal film made of aluminum or copper, and a metal material having a melting point higher than that of aluminum or copper.

14. An image display device according to claim 8, wherein said coating type insulating film is coated on an insulating film formed by dry process under vacuum condition or on an insulating film formed by wet process in a solution, or on a laminated film of these films.

15. An image display device according to claim 8, wherein said coating type insulating film is made of organic or inorganic silicon polymer.

16. An image display device according to claim 8, wherein said coating type insulating film is made of polysilazane.

* * * * *